(12) United States Patent
Lee

(10) Patent No.: US 10,026,825 B2
(45) Date of Patent: Jul. 17, 2018

(54) SEMICONDUCTOR DEVICE AND METHOD FOR FABRICATING THE SAME

(71) Applicant: Samsung Electronics Co., Ltd., Suwon-si (KR)

(72) Inventor: Jae Hoon Lee, Suwon-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/373,556

(22) Filed: Dec. 9, 2016

(65) Prior Publication Data

US 2017/0170305 A1    Jun. 15, 2017

(30) Foreign Application Priority Data

Dec. 11, 2015    (KR) .................. 10-2015-0176718

(51) Int. Cl.
*H01L 29/66* (2006.01)
*H01L 29/778* (2006.01)
*H01L 29/267* (2006.01)
*H01L 29/10* (2006.01)
*H01L 29/423* (2006.01)
*H01L 29/20* (2006.01)

(52) U.S. Cl.
CPC ...... *H01L 29/66462* (2013.01); *H01L 29/267* (2013.01); *H01L 29/7787* (2013.01); *H01L 29/1066* (2013.01); *H01L 29/2003* (2013.01); *H01L 29/4236* (2013.01)

(58) Field of Classification Search
None
See application file for complete search history.

(56) References Cited

U.S. PATENT DOCUMENTS

| | | | |
|---|---|---|---|
| 6,949,768 B1 | 9/2005 | Anderson et al. | |
| 7,663,161 B2 | 2/2010 | Kaibara et al. | |
| 7,834,456 B2 | 11/2010 | Tabatabaie et al. | |
| 7,928,427 B1* | 4/2011 | Chang | H01L 21/8258 257/24 |
| 8,492,261 B2 | 7/2013 | Van Hove et al. | |
| 8,604,518 B2 | 12/2013 | Bhuwalka et al. | |
| 8,610,172 B2 | 12/2013 | Guo et al. | |
| 8,624,326 B2 | 1/2014 | Chen et al. | |
| 8,669,591 B2 | 3/2014 | Marino | |
| 8,735,940 B2 | 5/2014 | Jeon et al. | |
| 8,759,879 B1 | 6/2014 | Tipimeni et al. | |
| 9,111,786 B1 | 8/2015 | Kub et al. | |
| 2011/0068407 A1 | 3/2011 | Yeh et al. | |
| 2011/0147706 A1* | 6/2011 | Radosavljevic | B82Y 10/00 257/18 |
| 2012/0025270 A1 | 2/2012 | Chang et al. | |

(Continued)

*Primary Examiner* — Phat X Cao
*Assistant Examiner* — Diana C Vieira
(74) *Attorney, Agent, or Firm* — Muir Patent Law, PLLC

(57) ABSTRACT

A semiconductor may include a semiconductor substrate including a first region and a second region disposed at opposite sides of the first region, a first trench formed in the first region, a buffer layer filling a portion of the first trench, a first semiconductor layer formed on the buffer layer, a second semiconductor layer forming a hetero-junction with the first semiconductor layer on the first semiconductor layer of the first region and a gate electrode formed on the second semiconductor layer of the first region.

6 Claims, 36 Drawing Sheets

(56) References Cited

U.S. PATENT DOCUMENTS

| | | |
|---|---|---|
| 2013/0043485 A1 | 2/2013 | Ueno |
| 2013/0320349 A1* | 12/2013 | Saunier ............ H01L 29/66462 257/76 |
| 2014/0091316 A1* | 4/2014 | Kikkawa ........... H01L 29/66462 257/76 |
| 2015/0076508 A1 | 3/2015 | Saito et al. |
| 2015/0076620 A1 | 3/2015 | Waldron et al. |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2015-0176718 filed on Dec. 11, 2015 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same.

2. Description of the Related Art

Semiconductor devices are utilized in a variety of industrial fields such as electronic equipment, automobiles and/or ships due to advantages such as light weight, small size and/or low cost. A field effect transistor (hereinafter, referred to as "transistor") is one of essential single elements constituting a semiconductor device. Typically, the transistor may include a source and a drain formed to be spaced apart from each other on a semiconductor substrate and a gate electrode covering the top of a channel region between the source and the drain. The source and the drain may be formed by injecting dopant ions onto the semiconductor substrate, and the gate electrode may be insulated from the channel region via the gate oxide film interposed between the semiconductor substrate and the gate electrode.

The above described form of transistor is widely used as a single element constituting a logic circuit and/or a switching device in the semiconductor device. In the rapidly developing electronics industry, demand for a high speed, high reliability and a multi-functional ability has been increasing for semiconductor devices. In order to meet this demand, the structure of semiconductor devices has been getting more complex and the size of the transistors has been highly miniaturized. Accordingly, transistors may decrease in turn-on current. The decrease in turn-on current may cause deterioration in operation speed of transistors. For these reasons, regarding the fabrication of high-integrated semiconductor devices, research has been undertaken on methods to increase mobility of carriers in channels for improvement of performance of the semiconductor devices. Attempts have been made to increase mobility of electrons or holes by application of tensile stress or compressive stress to channel regions of transistors to improve driving current characteristics and operation speed of the transistors. For example, in case of n-channel metal oxide semiconductor (NMOS) transistors, tensile stress may be applied to channel regions between the source and the drain, whereas in case of p-channel metal oxide semiconductor (PMOS) transistors, compressive stress may be applied thereto.

For this purpose, trench regions should be formed in the source and drain regions and a material having a less or greater lattice constant than that of silicon (Si) should be formed to enable application of stress between the source and drain regions. In this case, electrical properties may be changed according to depths of the trenches and sizes of thin films, and thus disadvantageously causing deterioration in yield.

SUMMARY

It is one technical object of the present disclosure to provide a semiconductor device with improved operation characteristics.

It is another technical object of the present disclosure to provide a method for fabricating a semiconductor device with improved operation characteristics.

The objects according to the present disclosure are not limited to those set forth above and objects other than those set forth above will be clearly understood to those skilled in the art from the following description.

According to an aspect of the present disclosure, there is provided a semiconductor device comprising a semiconductor substrate comprising a first region and a second region disposed at opposite sides of the first region, a first trench formed in the first region, a buffer layer formed at a bottom of the first trench to fill a portion of the first trench, a first semiconductor layer formed on the buffer layer, a second semiconductor layer forming a hetero-junction with the first semiconductor layer on the first semiconductor layer of the first region and a gate electrode formed on the second semiconductor layer of the first region.

According to another aspect of the present disclosure, there is provided a semiconductor device comprising a source electrode and a drain electrode formed to be spaced apart from each other on a substrate, a first trench formed between the source electrode and the drain source on the substrate and a gate structure filling the first trench, the gate structure comprising a buffer layer formed in the lowermost portion of the first trench, a first semiconductor layer being formed on the buffer layer and comprising a 2DEG layer, a second semiconductor layer formed on the first semiconductor layer and a gate electrode formed on the second semiconductor layer.

According to another aspect of the present disclosure a method of manufacturing a semiconductor device comprising: providing a semiconductor substrate comprising a first region and a second region disposed at opposite sides of the first region; forming a first trench in the first region; forming a buffer layer at a bottom of the first trench to fill a portion of the first trench; forming a first semiconductor layer on an upper surface of the buffer layer; forming a second semiconductor layer on the first semiconductor layer of the first region to form a hetero-junction with the first semiconductor layer; and forming a gate electrode on the second semiconductor layer of the first region.

BRIEF DESCRIPTION OF THE DRAWINGS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Figure 1:
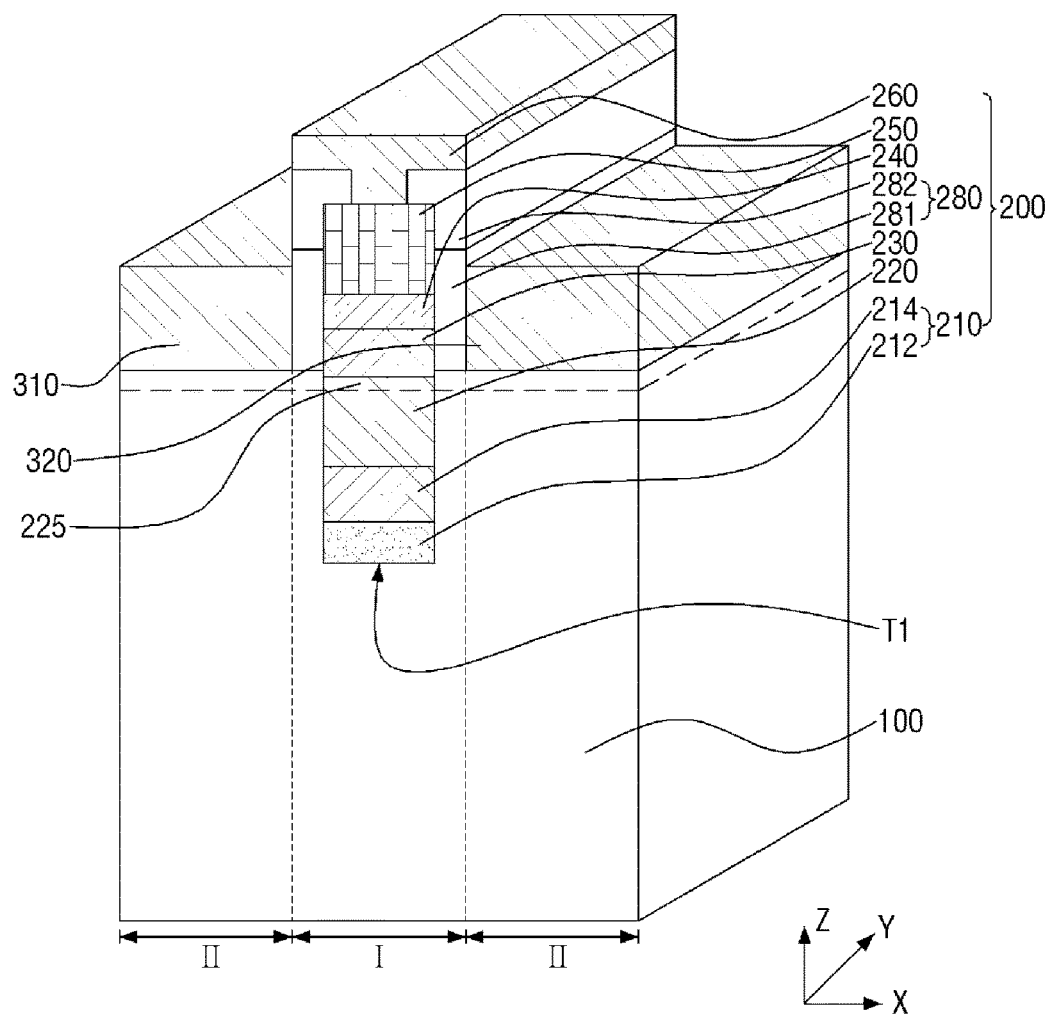

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs.

Figure 2:
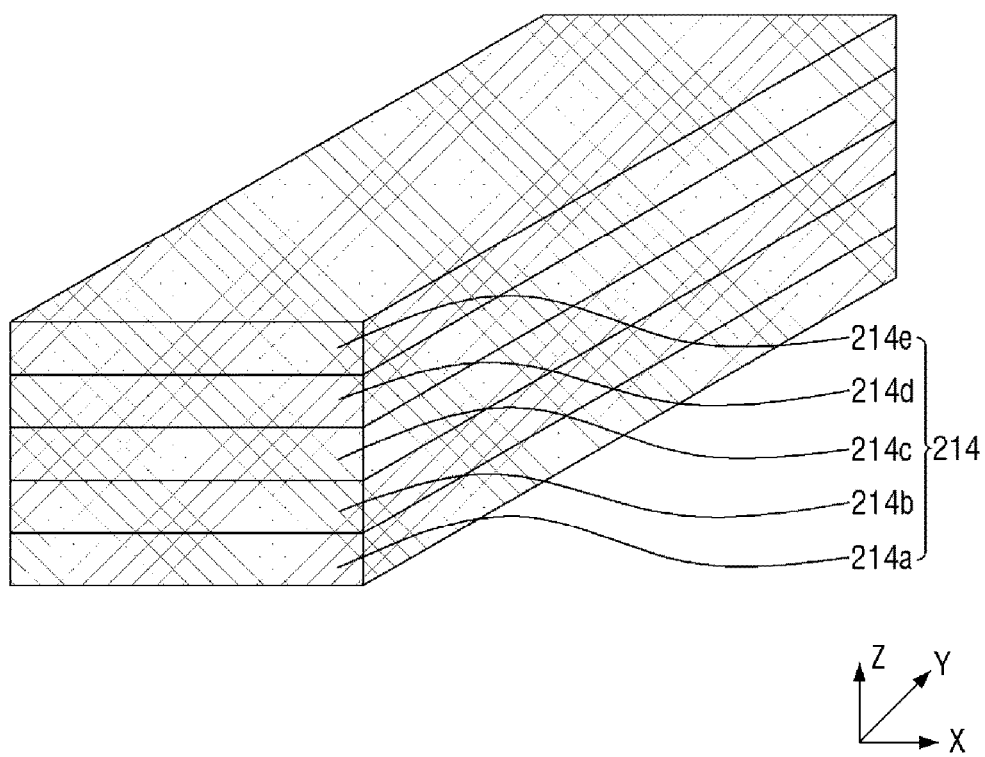
Figure 3:
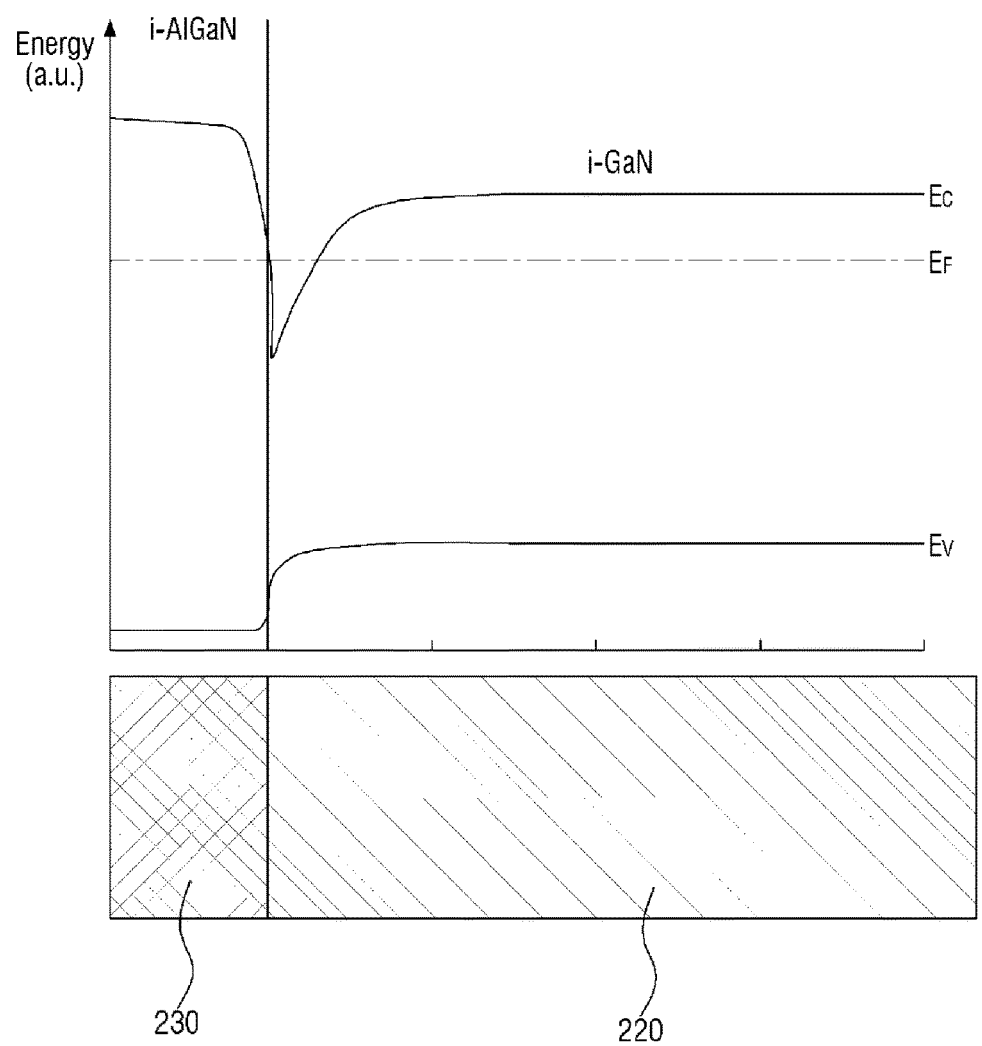
Figure 4:
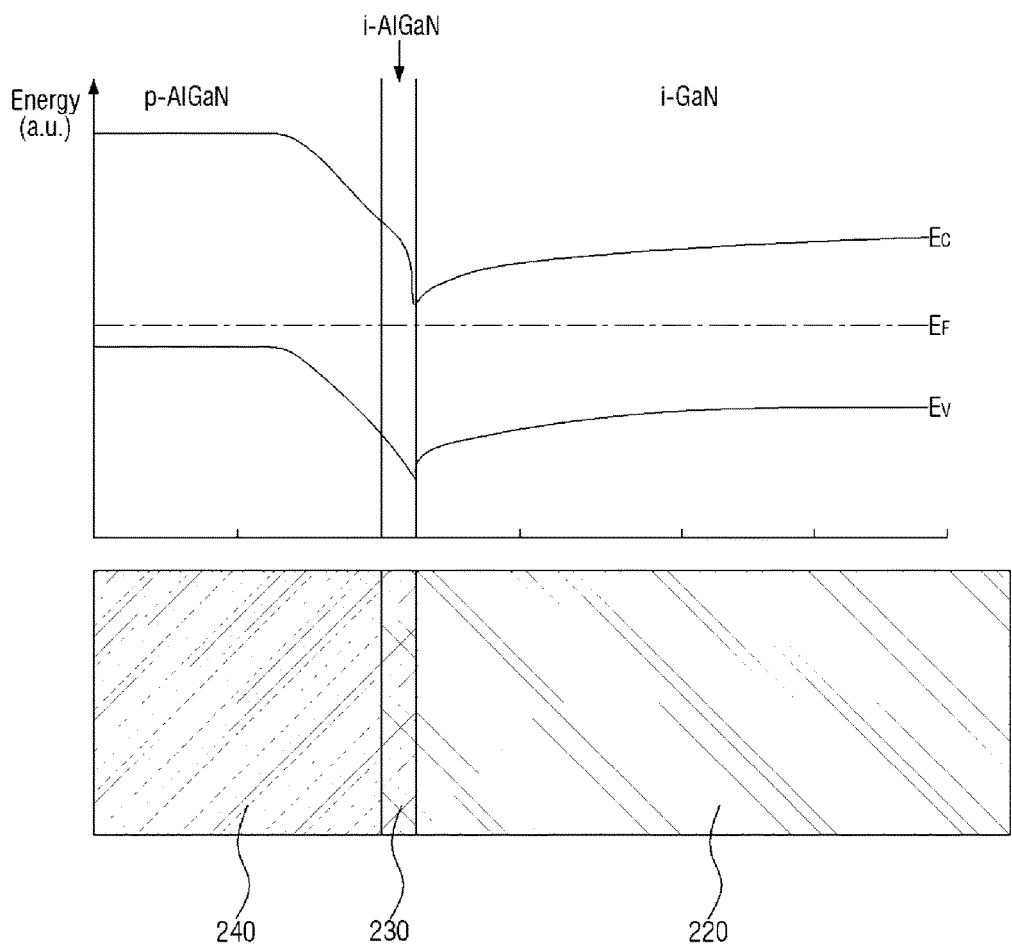
Figure 5:
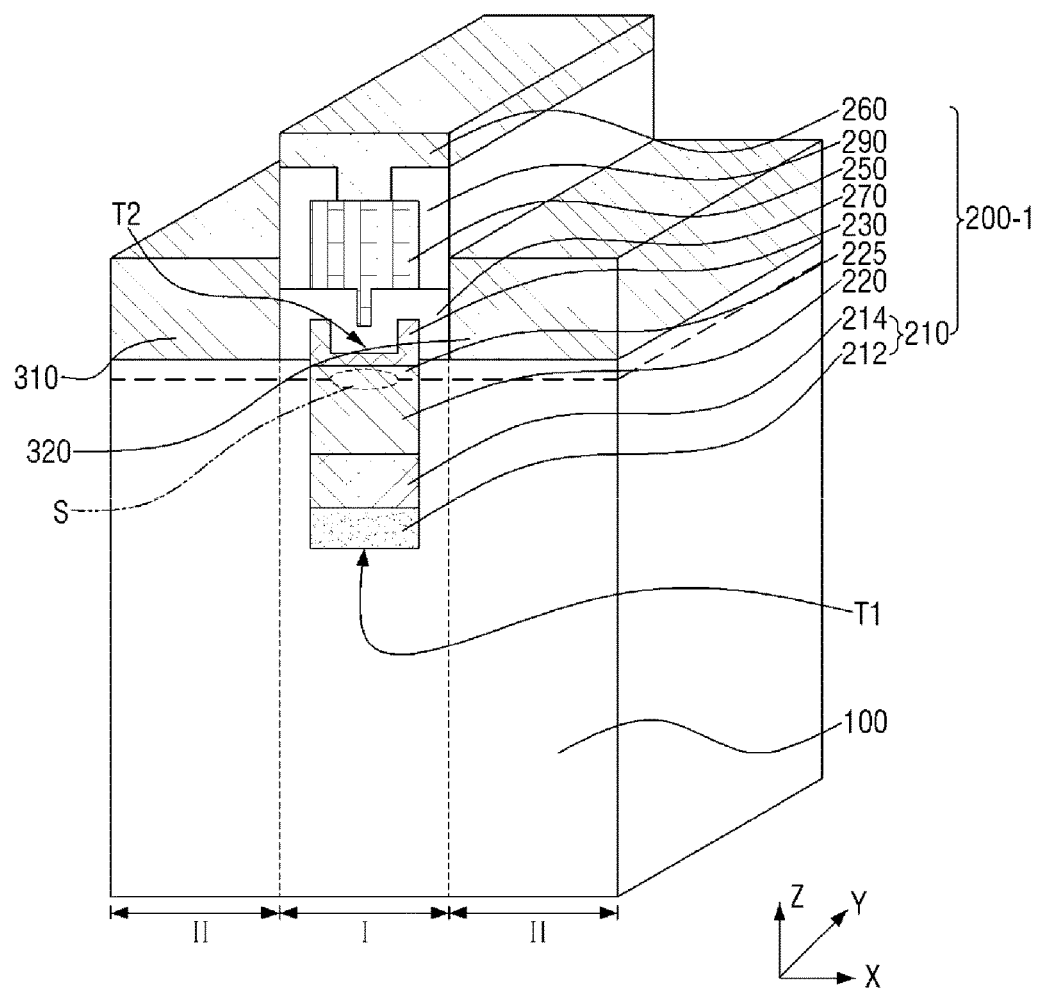
Figure 6:
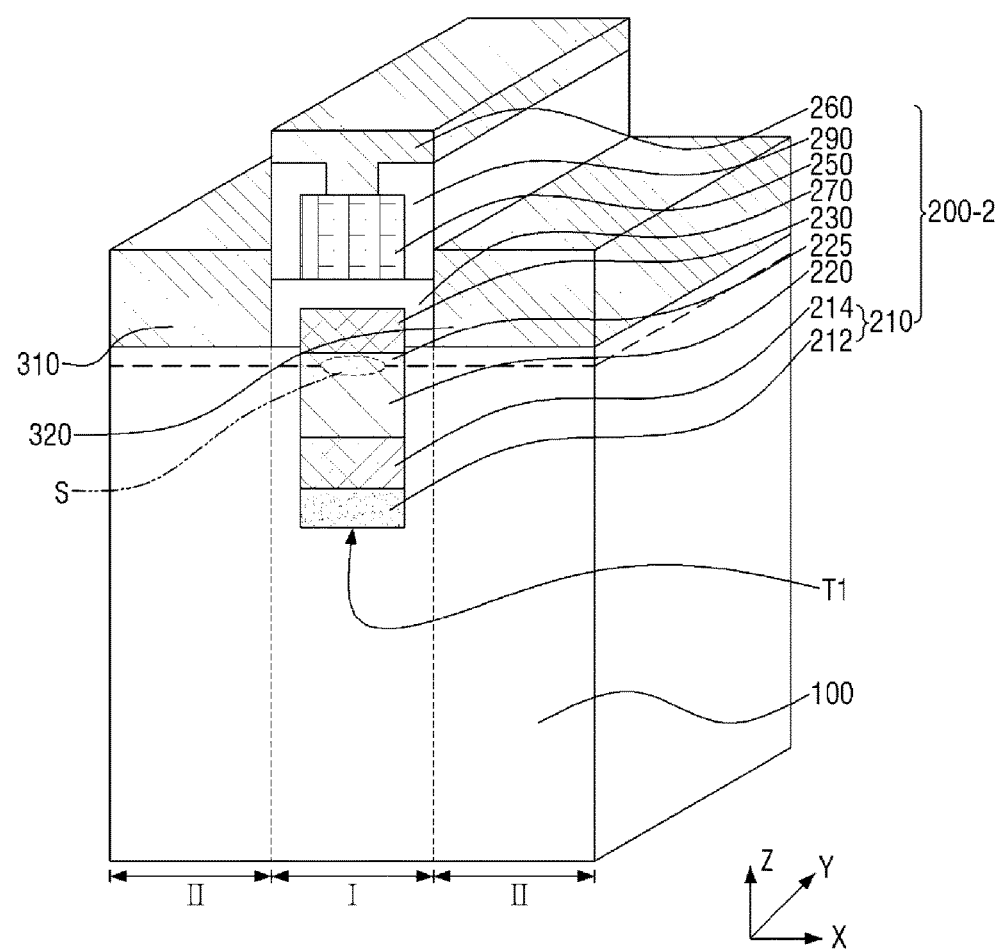
Figure 7:
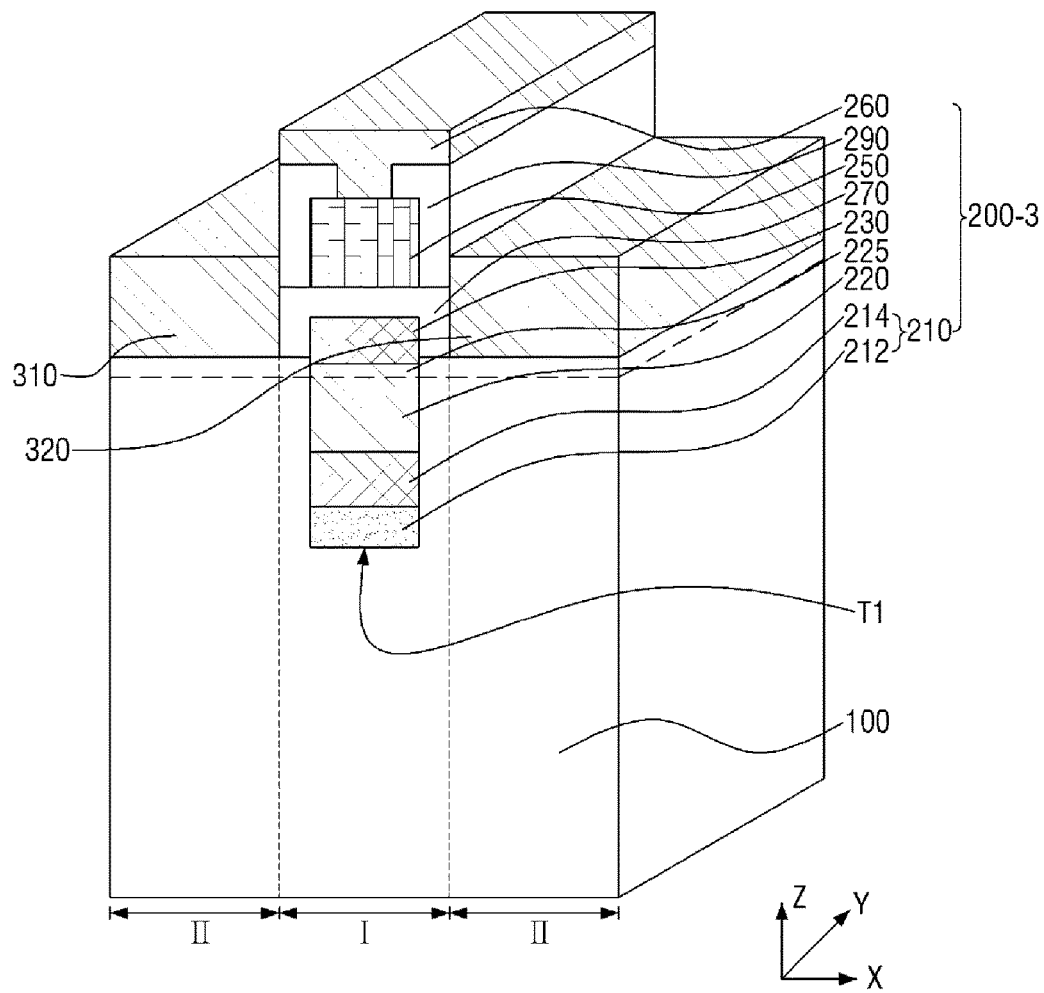

The above and other objects, features and advantages of the present disclosure will become more apparent to those of ordinary skill in the art by describing in detail exemplary embodiments thereof with reference to the accompanying drawings, in which:

FIG. 1 is a perspective view illustrating a semiconductor device according to some exemplary embodiments;

FIG. 2 is a perspective view illustrating a second buffer layer of FIG. 1 in detail according to some exemplary embodiments;

FIG. 3 is a schematic band diagram illustrating a hetero-junction of a first semiconductor layer and a second semiconductor layer of FIG. 1 according to some exemplary embodiments;

FIG. 4 is a schematic band diagram illustrating a junction of first to third semiconductor layers of FIG. 1 according to some exemplary embodiments;

FIG. 5 is a perspective view illustrating a semiconductor device according to some exemplary embodiments;

FIG. 6 is a perspective view illustrating a semiconductor device according to some exemplary embodiments;

FIG. 7 is a perspective view illustrating a semiconductor device according to some exemplary embodiments;

FIGS. 8 to 21 are views illustrating intermediate stages of fabrication, provided to explain a method for fabricating a semiconductor device according to some exemplary embodiments;

FIGS. 22 to 29 are views illustrating intermediate stages of fabrication, provided to explain a method of fabricating a semiconductor device according to some exemplary embodiments; and FIGS. 30 to 37 are views illustrating intermediate stages of fabrication, provided to explain a method for fabricating a semiconductor device according to some exemplary embodiments.

DETAILED DESCRIPTION

Hereinafter, a semiconductor device according to some exemplary embodiments will be described with reference to FIGS. 1 to 4.

FIG. 1 is a perspective view illustrating a semiconductor device according to some exemplary embodiments and FIG. 2 is a perspective view illustrating a second buffer layer of FIG. 1 in detail. FIG. 3 is a schematic band diagram illustrating a hetero-junction of a first semiconductor layer and a second semiconductor layer of FIG. 1 according to some exemplary embodiments. FIG. 4 is a schematic band diagram illustrating a junction of first to third semiconductor layers of FIG. 1 according to some exemplary embodiments.

Referring to FIGS. 1 to 4, the semiconductor device according to some exemplary embodiments includes a substrate 100, a first trench T1, a gate structure 200, a source electrode 310 and a drain electrode 320.

The substrate 100 may for example be a bulk silicon or a silicon-on-insulator (SOI). Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon. According to the exemplary embodiment described below, the substrate 100 is a silicon substrate.

The substrate 100 may include a first region I and second regions II. The first region I of the substrate 100 may be disposed between the second regions II. For example, the second regions II may be disposed at opposite sides of the first region I in a longitudinal ("X") direction. The gate structure 200 may be formed in the first region I, whereas the source electrode 310 and the drain electrode 320 may be respectively formed in the second regions II spaced apart from each other.

The first trench T1 may be formed in the first region I on the substrate 100. The first trench T1 may be formed by etching the substrate 100.

The gate structure 200 may include a buffer layer 210, a first semiconductor layer 220, a second semiconductor layer 230, a third semiconductor layer 240, a gate contact layer 250, a gate electrode 260 and a passivation layer 280.

The buffer layer 210 may function as a stress-reducing region for reducing occurrence of stress that may be generated by the difference in lattice constant between the substrate 100 and the first semiconductor layer 220, or of defects such as misfit dislocation caused thereby. For example, the buffer layer 210 may be formed so as to reduce the differences in lattice constant and coefficient of thermal expansion between the substrate 100 and the first semiconductor layer 220 and thereby prevent deterioration in crystallinity of the first semiconductor layer 220.

The buffer layer 210 may have a single- or multi-layer structure that includes one or more materials selected from nitrides including at least one of Al, Ga, In and B. For example, the material of the buffer layer 210 may be represented by $Al_xIn_yGa_{1-x-y}N$ ($0 \leq x \leq 1$, $0 \leq y \leq 1$, $x+y \leq 1$). Specifically, the buffer layer 210 may for example have a single- or multi-layer structure that includes at least one of various materials consisting of AlN, GaN, AlGaN, InGaN, AlInN, AlGaInN and the like.

In some embodiments, a predetermined seed layer may be further formed between the substrate 100 and the buffer layer 210. The seed layer may be a base layer for growth of the buffer layer 210. In some embodiments, the substrate 100 and the buffer layer 210 may be removed after fabrication of the semiconductor device. For example, the nitride-based semiconductor device according to the present embodiment may be optionally provided with the substrate 100 and the buffer layer 210.

Although not shown, the semiconductor device according to some exemplary embodiments may be further provided with a super-lattice layer formed as a multilayer structure of aluminum nitride/gallium nitride/aluminum nitride/gallium nitride between the substrate 100 and the buffer layer 210. However, exemplary embodiments are not limited to the example given above.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

The buffer layer 210 may include a first buffer layer 212 and a second buffer layer 214. The first buffer layer 212 may be formed to contact a bottom surface of the first trench T1. For example, the first buffer layer 212 may be formed at a bottom of the first trench T1 to fill a portion of the first trench T1. The first buffer layer 212 may function as a primary buffer layer that directly contacts the substrate 100.

The first buffer layer 212 may for example include gallium nitride, aluminum nitride, aluminum gallium nitride, silicon carbon nitride or a combination thereof. The thickness of the first buffer layer 212 is not particularly limited, but may be about 10 nm to about 20 nm.

The second buffer layer 214 may be formed on the first buffer layer 212. The second buffer layer 214 may have a stack structure in which a plurality of $Al_xGa_{1-x}N$ layers having different contents are stacked. Referring to FIG. 2, the second buffer layer 214 may have a 5-grade structure according to some exemplary embodiments. The second buffer layer 214 having the 5-grade structure as shown in FIG. 2, but such is only provided as an example and the disclosure is not limited thereto. For example, there is no limitation as to the number of grade layers so long as the second buffer layer 214 has a grade structure having a plurality of layers. For example, the second buffer layer 214 may have a 3-grade structure or a 6-grade structure.

The second buffer layer 214 may include first to fifth grade layers 214a to 214e. The first grade layer 214a may be formed on the first buffer layer 212 (e.g., on an upper surface of the first buffer layer 212). The second to fifth grade layers 214b to 214e may be sequentially stacked on the first grade layer 214a. For example, the first grade layer 214a may be formed on an upper surface of the first buffer layer 212 and the second to fifth grade layers 214b to 214e may be sequentially stacked on the first grade layer 214a in a manner such that an upper surface of the fifth grade layer 214e contacts a lower surface of the first semiconductor layer 220.

In some embodiments, the first to fifth grade layers 214a to 214e may have sequentially decreased Al contents. For example, the Al content of the first grade layer 214a may be 70% by weight, and the Al contents of the second to fifth grade layers 214b to 214e may be 50%, 30%, 10% and 5% by weight, respectively. However, this example is provided only for illustrative purpose, and exemplary embodiments are not limited thereto.

The first semiconductor layer 220 may be formed on the second buffer layer 214. For example, the first semiconductor layer 220 may be formed on an upper surface of the fifth grade layer 214e of the second buffer layer 214. The first semiconductor layer 220 may include at least one of a variety of materials consisting of aluminum nitride, gallium nitride, indium nitride, indium gallium nitride, aluminum gallium nitride, aluminum indium nitride and the like. However, the material for the first semiconductor layer 220 is not limited to those described above and any material that allows a 2-dimensional electron gas layer 225 to be formed therein may be used therefor. For example, the first semiconductor layer 220 may be an undoped gallium nitride layer.

In some embodiments, the first semiconductor layer 220 may be not doped or occasionally doped with a predetermined impurity. The impurity may be an n-type impurity. The n-type impurity may be for example Si, Ge or Sn. The n-type impurity may be doped at a concentration of less than $10^{18}$ atom/cm$^3$, for example, of about $10^{17}$ atom/cm$^3$, but the disclosure is not limited thereto. In some cases, the first semiconductor layer 220 may be a GaN layer doped with Al. In this exemplary embodiment, Al may be doped at a concentration of 1% or less and the GaN layer doped with Al may be formed using a method such as metal-organic chemical vapor deposition (MOCVD), molecular beam epitaxy (MBE), hydride vapor phase epitaxy (HVPE), sputtering, etc. However, the method for forming the first semiconductor layer 220 is not limited to those set forth above.

For example, the first semiconductor layer 220 may have a thickness ranging from about 10 nm to about 100 nm. However, exemplary embodiments of the thickness range are not limited to the example given above.

The second semiconductor layer 230 may be formed on the first semiconductor layer 220 such that it overlaps the first trench T1. In this exemplary embodiment, a lower surface of the first semiconductor layer 220 may be formed on an upper surface of the second buffer layer 214 and an upper surface of the first semiconductor layer 220 may be formed on a lower surface of the second semiconductor layer 230.

The second semiconductor layer 230 may include a material (semiconductor) that differs in energy band gap from the first semiconductor layer 220. For example, the second semiconductor layer 230 may include a material (semiconductor) that has a greater energy band gap than that of the first semiconductor layer 220. Specifically, the second semiconductor layer 230 may have a single- or multi-layer structure that includes one or more materials selected from nitrides including at least one of Al, Ga and In.

In some embodiments, the material for the second semiconductor layer 230 may be represented by $Al_xIn_yGa_{1-x-y}N$ (0≤x≤1, 0≤y≤1, x+y≤1). Specifically, the second semiconductor layer 230 may for example have a single- or multi-layer structure that includes at least one of various materials consisting of GaN, InN, AlGaN, AlInN, InGaN, AlN, AlInGaN and the like.

In some embodiments, the material for the second semiconductor layer 230 may be represented by $Al_xGa_{1-x}N$ (0<x≤0.6 or 0.1≤x≤0.5). The second semiconductor layer 230 may broadly have an Al content of 60 at % or less, specifically, about 10 at % to about 40 at %. The second semiconductor layer 230 may be doped with an n-type impurity. The n-type impurity may for example be Si, Ge or Sn. The n-type impurity may be doped at a concentration of about $10^{18}$ to about $10^{20}$ atom/cm$^3$.

The second semiconductor layer 230 may be doped with a predetermined impurity as described above, but may be undoped in some cases. The second semiconductor layer 230 may have a thickness of several tens of nanometers or less, for example, 10 nm to 50 nm or 20 nm to 30 nm. However, exemplary embodiments are not limited to the example thickness given above.

With respect to the hetero junction structure of the first semiconductor layer 220 and the second semiconductor layer 230 (e.g., when the first semiconductor layer 220 is formed of materials different from those utilized to form the second semiconductor layer 230) differ from each other in energy band gap, electrons may be present at a high concentration on the junction interface due to great band discontinuity thereon. Accordingly, a 2-dimensional electron gas (i.e., 2DEG) layer 225 may be formed in a portion of the first semiconductor layer 220. The 2DEG layer 225 may be formed within the first semiconductor layer 220 under the interface between the first semiconductor layer 220 and the second semiconductor layer 230, as shown by a dotted line.

For example, the 2DEG layer 225 may be partially formed in the first semiconductor layer 220 near the interface the first semiconductor layer 220 contacts the second semiconductor layer 230. In such a case of hetero-junction structure in which the first semiconductor layer 220 and the second semiconductor layer 230 are gallium nitride and aluminum gallium nitride, respectively, the 2DEG layer may be formed by spontaneous polarization and piezo polarization caused by tensile strain in the III-group nitride layers (For example, gallium nitride layer and aluminum gallium nitride layer).

The 2DEG layer 225 formed in the first semiconductor layer 220 may be used as a passage, i.e., channel, allowing current to flow between the source electrode 310 and the drain electrode 320.

The third semiconductor layer 240 may be formed between the gate electrode 260 and the second semiconductor layer 230 to obtain a normally off property. For example, in some embodiments, the third semiconductor layer 240 may be formed between the lowermost surface of the gate electrode 260 and the uppermost surface of the second semiconductor layer 230. The term "normally off property" used herein refers to a property in which an off state is when a voltage is not applied to the gate electrode 260, for example, in a normal mode, and an on state is when a voltage is applied to the gate electrode 260. The third semiconductor layer 240 may be provided with a depletion region in the 2DEG layer 225 formed in the first semiconductor layer 220, thereby forming an area where the 2DEG layer 225 discontinues between the source electrode 310 and the drain electrode 320.

FIGS. 3 and 4 are schematic band diagrams illustrating a structure in which the gate electrode 260, the third semiconductor layer 240, the second semiconductor layer 230 and the first semiconductor layer 220 are stacked in a sequential manner in a negative Z direction as illustrated in FIG. 1. FIGS. 3 and 4 illustrate band diagrams of the case where the third semiconductor layer 240 is a p-doped AlGaN layer, the second semiconductor layer 230 is an undoped AlGaN layer (intrinsic AlGaN layer) and the first semiconductor layer 220 is an undoped GaN layer (intrinsic GaN layer).

Referring to FIG. 3, when only the first semiconductor layer 220 and the second semiconductor layer 230 form hetero-junction, conduction band $E_C$ on the interface is lower than Fermi level $E_F$, which may result in normally on property.

On the other hand, referring to FIG. 4 illustrating a structure in which the third semiconductor layer 240 is further formed, the level of energy band of the second semiconductor layer 230 may increase due to p-n junction generated by the third semiconductor layer 240 formed between the second semiconductor layer 230 and the gate electrode 260. For example, since conduction band $E_C$ in regions between the first semiconductor layer 220 and the gate electrode 260 is higher than Fermi level $E_F$ in a state where a bias is not applied to the gate electrode 260, a depletion region is formed in the first semiconductor layer 220 under the gate electrode 260 and the 2DEG layer 225 may be thus depleted. Accordingly, the 2DEG layer 225 may be not formed in the first semiconductor layer 220 under the third semiconductor layer 240 and there may be present a normally off structure in which current does not flow in a state where a bias is not applied to the gate electrode 260.

In exemplary embodiments, the third semiconductor layer 240 may have a thickness of about 10 nm to about 200 nm. When the thickness of the third semiconductor layer 240 is less than 10 nm, the depletion region may not be formed up to the 2DEG layer 225 of the first semiconductor layer 220, thus causing a normally "on" property where currents flow in an off state. When the thickness of the third semiconductor layer 240 is greater than 200 nm, the third semiconductor layer 240 may excessively increase the band gap energy of the first semiconductor layer 220 disposed thereunder and therefore may excessively increase the bias voltage applied to the gate electrode 260 to set to an on state.

In exemplary embodiments, the third semiconductor layer 240 may include gallium nitride, aluminum gallium nitride or the like including an impurity such as magnesium (Ma), zinc (Zn), beryllium (Be), etc. at a doping concentration of about $1\times10^{17}/cm^3$ to $1\times10^{22}/cm^3$.

The gate contact layer 250 may be formed on the third semiconductor layer 240. The gate contact layer 250 may be formed between the gate electrode 260 and the third semiconductor layer 240 for schottky barrier. An schottky barrier is an electrostatic depletion layer formed at the junction of a metal and a semiconductor, which may cause the semiconductor to act as an electrical rectifier.

The gate contact layer 250 may be formed of a metal material including at least one of Ni, W and NiSi. However, exemplary embodiments are not limited to the example metal material given above.

The passivation layer 280 may be formed on the substrate 100 on side surfaces of the second semiconductor layer 230, the third semiconductor layer 240, the gate contact layer 250 and the gate electrode 260. The passivation layer 280 may include a first passivation layer 281 and a second passivation layer 282.

The first passivation layer 281 may be formed to surround side walls of the second semiconductor layer 230 and the third semiconductor layer 240, and a portion of a side wall of the gate contact layer 250 on the substrate 100.

The second passivation layer 282 may be formed on the first passivation layer 281. For example, the second passivation layer 282 may be formed on an upper surface of the first passivation layer 281. The first passivation layer 281 and the second passivation layer 282 may include silicon oxide, silicon nitride, silicon oxynitride or the like. The first passivation layer 281 and the second passivation layer 282 may include identical or different materials.

The source electrode 310 and the drain electrode 320 may contact the first passivation layer 281 and the second passivation layer 282, respectively. The first semiconductor layer 220 formed between the source electrode 310 and the drain electrode 320 is provided in a portion thereof with the 2DEG layer 225, which may function as a channel region of the semiconductor device according to some exemplary embodiments.

In some embodiments, the source electrode 310 and the drain electrode 320 may be formed of a material selected from the group consisting of Ni, Al, Ti, TiN, Pt, Au, $RuO^2$, V, W, WN, Hf, HfN, Mo, NiSi, $CoSi_2$, WSi, PtSi, Ir, Zr, Ta, TaN, Cu, Ru, Co and a combination thereof. Regarding the semiconductor device according to some exemplary embodiments, the source electrode 310 and the drain electrode 320 may be formed by forming an ohmic contact with the substrate 100 using metals such as Ta/Al/W/TiN and then conducting heat treatment at 500 to 550° C. Alternatively, the source electrode 310 and the drain electrode 320 may be formed of Ta/Al/Ni/Au.

The gate electrode 260 may be formed on the third semiconductor layer 240 between the source electrode 310 and the drain electrode 320. The gate electrode 260 may be formed to overlap the third semiconductor layer 240. The width of the gate electrode 260 is substantially equal to that of the third semiconductor layer 240 as shown in FIG. 1, but the width of the gate electrode 260 may be less than that of the third semiconductor layer 240.

The gate electrode 260 may be formed of a material selected from the group consisting of Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co and a combination thereof.

The semiconductor device according to some exemplary embodiments may be formed using GaN-based nitride. The GaN-based nitride semiconductor has excellent properties such as great energy gap, superior chemical stability and high electron saturation speed ($\sim 3\times 10^7$ cm/sec) and are readily applied to optical devices as well as high-frequency high-power electronic devices and researches are thus actively made thereon all over the world. In particular, electronic devices using the GaN-based nitride semiconductor has various advantages including high breakdown field ($\sim 3\times 10^6$ V/cm), maximum current density, stable high-temperature operation, high thermal conductivity, etc., and in the case of heterostructure field effect transistors (HFETs) using hetero-junction of AlGaN/GaN (e.g., in which, according to some example embodiments, the first semiconductor layer 220 and the second semiconductor layer 230 are gallium nitride and aluminum gallium nitride, respectively), a high concentration of electrons may be present on the AlGaN/GaN junction interface due to great band-discontinuity on the junction interface and electron mobility may thus increase to 2,000 $Vs/cm^2$ or more.

Furthermore, the third semiconductor layer 240 may provide normally off property and prevent power consumption in a normal mode. As a result, it is possible to provide a semiconductor device which has high power efficiency, high electron mobility and thus improved operation characteristics.

Hereinbelow, a semiconductor device according to some exemplary embodiments will be described with reference to FIG. 5. Meanwhile, items overlapping with those described above with reference to FIGS. 1 to 4 will be mentioned as briefly as possible or omitted for the sake of brevity.

FIG. 5 is a perspective view illustrating a semiconductor device according to some exemplary embodiments.

Referring to FIG. 5, the semiconductor device according to some exemplary embodiments may further include a second trench T2, a gate insulating film 270 and a third passivation layer 290.

The second trench T2 may be formed on the second semiconductor layer 230. For example, the second trench T2 may be formed on an upper surface of the second semiconductor layer 230. The second trench T2 may be formed by removing a portion (e.g., a portion of the upper surface) of the second semiconductor layer 230. The second trench T2 may decrease the thickness of the portion of the second semiconductor layer 230.

The second semiconductor layer 230 which has decreased in thickness due to formation of the second trench T2 may not form the 2DEG layer 225 although it is connected to the first semiconductor layer 220. As a result, the 2DEG layer 225 may have a depletion region S. The depletion region S may overlap the portion of the second semiconductor layer 230 where the second trench T2 is formed in a third direction Z.

In some embodiments, the gate insulating film 270 may be formed on the second semiconductor layer 230 and the substrate 100. The gate insulating film 270 may be conformally formed along upper surfaces of the second semiconductor layer 230 and the substrate 100. However, exemplary embodiments are not limited to the example given above. The gate insulating film 270 may for example include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO and a combination thereof. Also, any material may be used for the gate insulating film 270 without limitation to those described above so long as it is a gate insulating film material used in general transistors.

In the semiconductor device according to this exemplary embodiment, the gate insulating film 270 may be formed of $Al_2O_3$. The gate insulating film 270 of $Al_2O_3$ may be formed to a thickness of about 20 to 50 nm by atomic layer deposition (ALD). However, exemplary embodiments are not limited to the thickness example given above.

The gate insulating film 270 may entirely not fill the second trench T2. Accordingly, another trench may be formed on the gate insulating film 270.

The gate contact layer 250 may be formed on the gate insulating film 270. The gate insulating film 270 may entirely fill the second trench T2. The gate contact layer 250 may fill the other trench formed on the gate insulating film 270.

The third passivation layer 290 may be formed on the gate insulating film 270. The third passivation layer 290 may surround a side surface of the gate contact layer 250. The third passivation layer 290 may surround a portion of the side surface of the gate electrode 260.

Regarding the semiconductor device according to some exemplary embodiments, the second trench T2 formed on the second semiconductor layer 230 may reduce the thickness of the second semiconductor layer 230, thereby causing formation of depletion region S. As a result, there can be achieved the normally off property in which an off-state is in a normal mode and an on-state is only when a voltage is applied to the gate electrode 260.

Hereinbelow, a semiconductor device according to some exemplary embodiments will be described with reference to FIG. 6. Meanwhile, items overlapping with those described above with reference to FIGS. 1 to 5 will be mentioned as briefly as possible or omitted for the sake of brevity.

FIG. 6 is a perspective view illustrating a semiconductor device according to some exemplary embodiments.

Referring to FIG. 6, the semiconductor device according to some exemplary embodiments may form a depletion region S without the second trench T2 or the third semiconductor layer 240.

The second semiconductor layer 230 may be formed to a uniform thickness on the first semiconductor layer 220. The second semiconductor layer 230 may be hetero-junction onto the first semiconductor layer 220 to form a 2DEG layer in the first semiconductor layer 220.

The gate insulating film 270 may be formed on the second semiconductor layer 230. The gate insulating film 270 may be conformally formed on the second semiconductor layer 230. Since the second semiconductor layer 230 has a flat upper surface, the gate insulating film 270 may be also flatly formed along upper and side surfaces of the second semiconductor layer 230. For example, the first gate insulating film 270 may have a reverse "U" shape, but the disclosure is not limited to this shape.

The depletion region S may be formed in the first semiconductor layer 220 under the interface between the first semiconductor layer 220 and the second semiconductor layer 230. In some exemplary embodiments, the depletion region S may mean a part where the 2DEG layer 225 is not formed.

This may be determined depending on plasma treatment on the second semiconductor layer 230 in the fabrication process of the semiconductor device according to some exemplary embodiments. For example, the 2DEG layer 225 may be not formed or partially discontinuously formed due to plasma treatment on the second semiconductor layer 230.

Accordingly, the semiconductor device according to some exemplary embodiments may have normally off property, thereby minimizing power consumption.

Hereinbelow, a semiconductor device according to some exemplary embodiments will be described with reference to FIG. 7. Meanwhile, items overlapping with those described above with reference to FIGS. 1 to 6 will be mentioned as briefly as possible or omitted for the sake of brevity.

FIG. 7 is a perspective view illustrating a semiconductor device according to some exemplary embodiments.

Referring to FIG. 7, the semiconductor device according to some exemplary embodiments does not include a depletion region S.

Specifically, the second semiconductor layer 230 may be formed on the first semiconductor layer 220. With respect to the hetero-junction structure of the first semiconductor layer 220 and the second semiconductor layer 230 differing from each other in energy band gap, electrons may be present at a high concentration on the junction interface due to great band discontinuity thereon. Accordingly, a 2-dimensional electron gas (i.e., 2DEG) layer 225 may be formed in a portion of the first semiconductor layer 220. The 2DEG layer 225 may be formed within the first semiconductor layer 220 under the interface between the first semiconductor layer 220 and the second semiconductor layer 230, as shown by a dotted line.

For example, the 2DEG layer 225 may be partially formed in the first semiconductor layer 220 near the interface the first semiconductor layer 220 contacts the second semiconductor layer 230. In such a case of hetero-junction structure in which the first semiconductor layer 220 and the second semiconductor layer 230 are gallium nitride and aluminum gallium nitride, respectively, the 2DEG layer may be formed by spontaneous polarization and piezo polarization caused by tensile strain in the III-group nitride layers (for example, gallium nitride layer and aluminum gallium nitride layer).

Accordingly, the semiconductor device according to some exemplary embodiments may have the normally-on property.

The semiconductor device according to some exemplary embodiments may have very high electron mobility due to presence of high concentration of electrons. Accordingly, it is possible to provide a semiconductor device with improved operation characteristics and speed.

Hereinbelow, a method of fabricating a semiconductor device according to an exemplary embodiment will be described with reference to FIGS. 8 and 21. The semiconductor device obtained according to the method for fabricating a semiconductor device shown in FIGS. 8 and 21 may be the same as that shown in FIG. 1. Items overlapping with those described above with reference to the semiconductor device of FIGS. 1 to 7 will be mentioned as briefly as possible or omitted for the sake of brevity.

FIGS. 8 to 21 are views illustrating intermediate stages of fabrication, provided to explain a method for fabricating a semiconductor device according to some exemplary embodiments.

Figure 8:
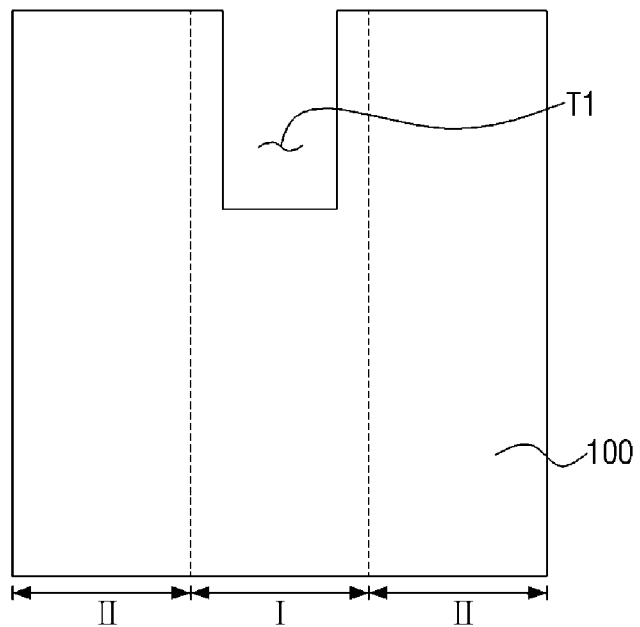

Next, referring to FIG. 8, a first trench T1 is formed in a first region I of a substrate 100.

The substrate 100 may for example be a bulk silicon or a silicon-on-insulator (SOI). Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon. The following description will be made on condition that the substrate is a silicon substrate.

The substrate 100 may include a first region I and a pair of second regions II. The first region I of the substrate 100 may be disposed between the second regions II. For example, the second regions II may be disposed at opposite sides of the first region I. The gate structure 200 may be formed in the first region I, whereas the source electrode 310 and the drain electrode 320 may be respectively formed in the second regions II spaced apart from each other.

The first trench T1 may be formed in the first region I on the substrate 100. The first trench T1 may be formed by etching the substrate 100.

Figure 9:
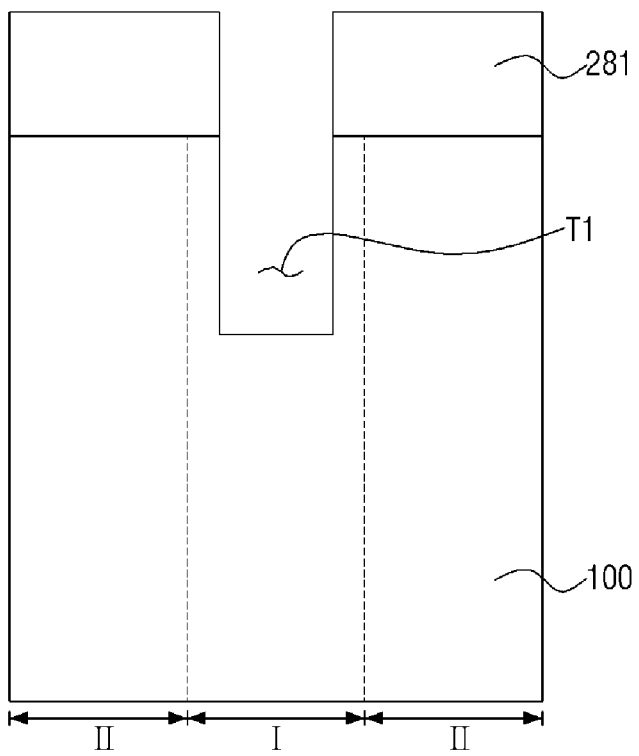

Next, referring to FIG. 9, a first passivation layer 281 is formed.

The first passivation layer 281 may be formed on a portion of the first region I and on the second region II of the substrate 100. For example, the first passivation layer 281 may be formed on the upper surface of the substrate 100 except for the first trench T1.

The first passivation layer 281 and the second passivation layer 282 may include silicon oxide, silicon nitride, silicon oxynitride or the like.

The first trench T1 is first formed and the first passivation layer 281 is then formed, as shown in FIGS. 8 and 9, but not limited thereto. After formation of the first passivation layer 281 on the upper surface of the substrate 100, the first trench T1 may be formed by etching both the substrate 100 and the first passivation layer 281.

Figure 10:
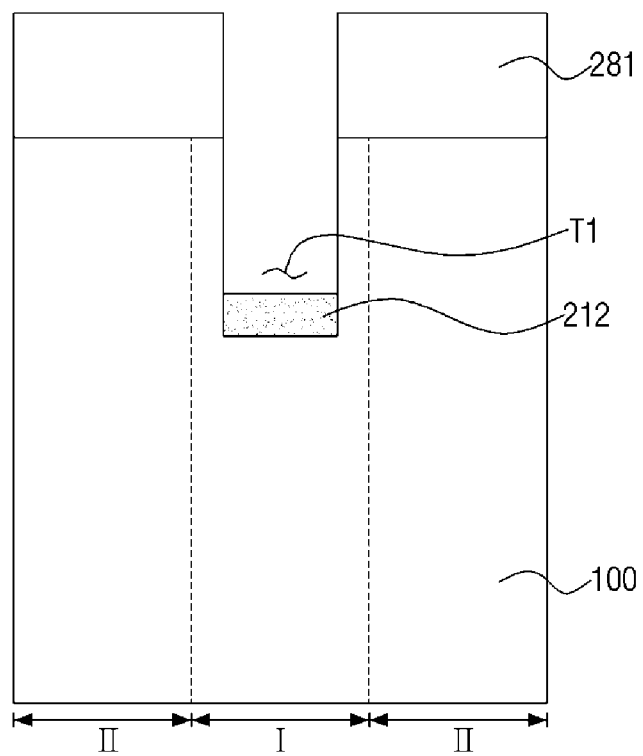

Next, referring to FIG. 10, a first buffer layer 212 is formed on a bottom surface of the first trench T1.

The first buffer layer 212 may fill a portion of the first trench T1. The upper surface of the first buffer layer 212 may be lower than the upper surface of the substrate 100, except for the first trench T1. For example, the uppermost surface of the first buffer layer 212 may be lower than the uppermost surface of the substrate 100.

The first buffer layer 212 may for example include gallium nitride, aluminum nitride, aluminum gallium nitride, silicon carbon nitride or a combination thereof. The thickness of the first buffer layer 212 is not particularly limited, but may be about 10 nm to about 20 nm.

Figure 11:
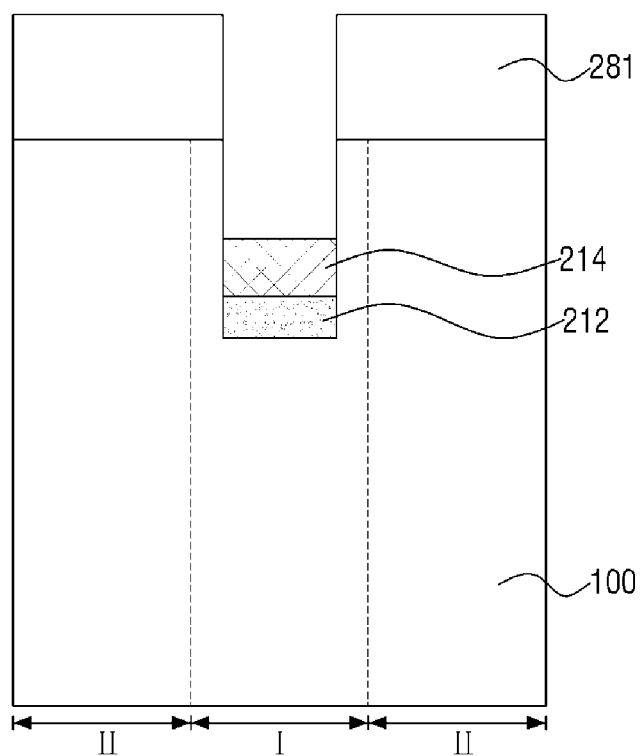

Next, referring to FIG. 11, a second buffer layer 214 is formed on the first buffer layer 212.

The second buffer layer 214 may be formed on the first buffer layer 212. The second buffer layer 214 may have a structure in which a plurality of $Al_xGa_{1-x}N$ layers having different contents are stacked. Referring to FIG. 2, the second buffer layer 214 may have a 5-grade structure. The second buffer layer 214 has the 5-grade structure as shown in FIG. 2, but such is only provided as an example and it is not limited thereto. For example, there is no limitation as to the number of grade layers so long as the second buffer layer 214 has a grade structure having a plurality of layers.

The second buffer layer 214 may include first to fifth grade layers 214a to 214e. The first grade layer 214a may be formed on the first buffer layer 212. The second to fifth grade layers 214b to 214e may be sequentially stacked on the first grade layer 214a. For example, the first grade layer 214a may be formed on an upper surface of the first buffer layer 212 and the second to fifth grade layers 214b to 214e may be sequentially stacked on the first grade layer 214a in a manner such that an upper surface of the fifth grade layer 214e contacts a lower surface of the first semiconductor layer 220. The first to five grade layers 214a to 214e may have sequentially decreased Al contents. For example, the Al content of the first grade layer 214a may be 70% by weight, and the Al contents of the second to fifth grade layers 214b to 214e may be 50%, 30%, 10% and 5%, respectively. However, this example is provided only for illustrative purpose, and exemplary embodiments are not limited thereto. For example, in an alternative embodiment, the first to fifth grade layers 214a to 214e may have sequentially increased Al contents. For example, the Al content of the first grade layer 214a may be 5% by weight, and the Al contents of the second to fifth grade layers 214b to 214e may be 10%, 30%, 50% and 70% by weight, respectively.

The first buffer layer 212 and the second buffer layer 214 may function as stress-reducing regions for reducing occurrence of stress that may be generated by difference in lattice constant between the substrate 100 and the first semiconductor layer 220 disposed thereon, or of defects such as misfit dislocation caused thereby. For example, the buffer layer 210 may be formed so as to reduce the differences in lattice constant and coefficient of thermal expansion between the substrate 100 and the first semiconductor layer 220 and thereby prevent deterioration in crystallinity of the first semiconductor layer 220.

Figure 12:
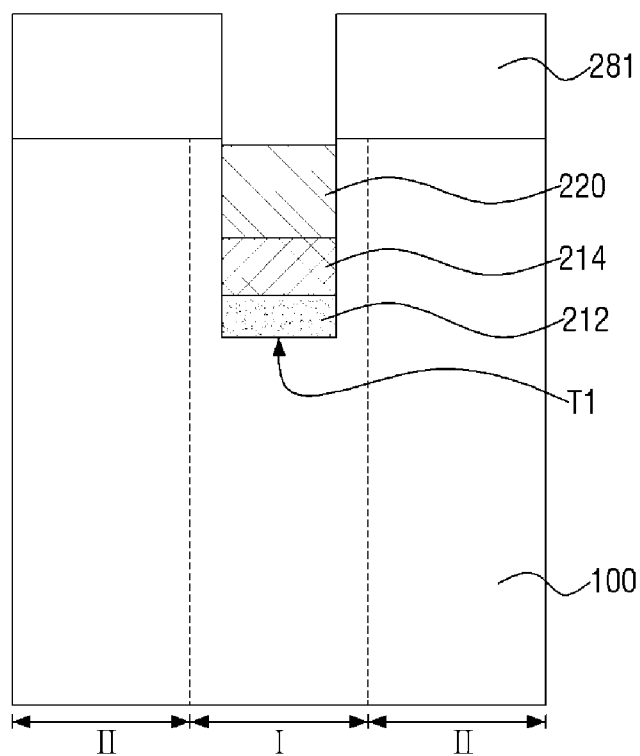

Next, referring to FIG. 12, a first semiconductor layer 220 is formed.

The first semiconductor layer 220 may be formed on the second buffer layer 214. The first semiconductor layer 220 may include at least one of a variety of materials consisting of aluminum nitride, gallium nitride, indium nitride, indium gallium nitride, aluminum gallium nitride, aluminum indium nitride and the like. However, the material for the first semiconductor layer 220 is not limited to those described above and any material that allows a 2-dimensional electron gas (2DEG) layer 225 to be formed therein may be used therefor. For example, the first semiconductor layer 220 may be an undoped gallium nitride layer.

The first semiconductor layer 220 may be not doped or occasionally doped with a predetermined impurity. The impurity may be an n-type impurity. The n-type impurity may be for example Si, Ge or Sn. The n-type impurity may be doped at a concentration of less than $10^{18}$ atom/cm$^3$, for example, of about $10^{17}$ atom/cm$^3$. In some cases, the first semiconductor layer 220 may be a GaN layer doped with Al. In this case, Al may be doped at a concentration of 1% or less and the GaN layer doped with Al may be formed using a method such as metal-organic chemical vapor deposition (MOCVD), molecular beam epitaxy (MBE), hydride vapor phase epitaxy (HVPE) and sputtering. However, the method for forming the first semiconductor layer 220 is not limited to those set forth above.

The upper surface of the first semiconductor layer 220 may be formed lower than the upper surface of the substrate 10. For example, the first semiconductor layer 220 may have a thickness ranging from about 10 nm to about 100 nm.

However, exemplary embodiments are not limited to the thickness example given above.

Figure 13:
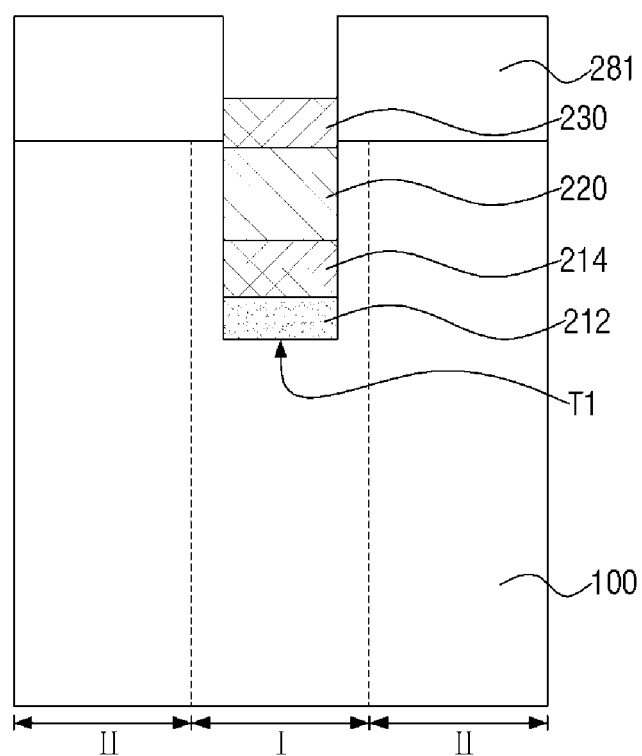

Next, referring to FIG. 13, a second semiconductor layer 230 is formed.

The second semiconductor layer 230 may be formed on the first semiconductor layer 220. The second semiconductor layer 230 may vertically overlap the first semiconductor layer 220.

A bottom surface of the second semiconductor layer 230 may be lower than the upper surface of the substrate 100 and an upper surface of the second semiconductor layer 230 may be higher than the upper surface of the substrate 100. For example, the lowermost surface of the second semiconductor layer 230 may be lower than the uppermost surface of the substrate 100 and an uppermost surface of the second semiconductor layer 230 may be higher than the uppermost surface of the substrate 100. The upper surface of the second semiconductor layer 230 may be lower than the upper surface of the first passivation layer 281. For example, the uppermost surface of the second semiconductor layer 230 may be lower than the uppermost surface of the first passivation layer 281. However, exemplary embodiments are not limited to the example given above.

In some embodiments, the second semiconductor layer 230 may include a material (semiconductor) that differs in energy band gap from the first semiconductor layer 220. For example, the second semiconductor layer 230 may include a material (semiconductor) that has a greater energy band gap than that of the first semiconductor layer 220. Specifically, the second semiconductor layer 230 may have a single- or multi-layer structure that includes one or more materials selected from nitrides including at least one of Al, Ga and In.

The material for the second semiconductor layer 230 may be represented by $Al_xIn_yGa_{1-x-y}N$ (0≤x≤1, 0≤y≤1, x+y≤1). Specifically, the second semiconductor layer 230 may for example have a single- or multi-layer structure that includes at least one of various materials consisting of GaN, InN, AlGaN, AlInN, InGaN, AlN, AlInGaN and the like.

With respect to the hetero-junction structure of the first semiconductor layer 220 and the second semiconductor layer 230 differing from each other in energy band gap, electrons may be present at a high concentration on the junction interface due to great band discontinuity thereon. Accordingly, a 2-dimensional electron gas (i.e., 2DEG) layer 225 may be formed in a portion of the first semiconductor layer 220. The 2DEG layer 225 may be formed within the first semiconductor layer 220 under the interface between the first semiconductor layer 220 and the second semiconductor layer 230, as shown by a dotted line.

Figure 14:
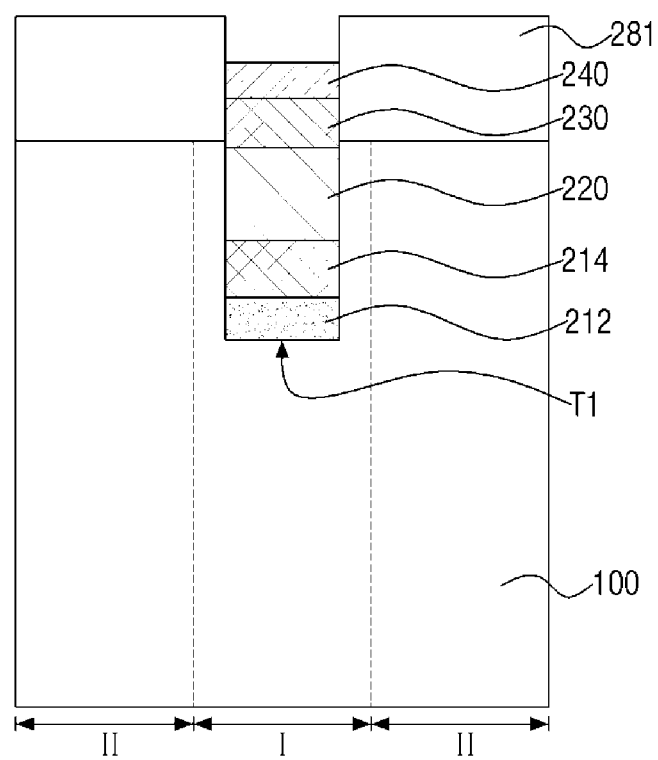

Next, referring to FIG. 14, a third semiconductor layer 240 is formed.

The third semiconductor layer 240 may be formed on the second semiconductor layer 230. An upper surface of the third semiconductor layer 240 may be lower than the upper surface of the first passivation layer 281. For example, the uppermost surface of the third semiconductor layer 240 may be lower than the uppermost surface of the first passivation layer 281. However, exemplary embodiments are not limited to the example given above.

The third semiconductor layer 240 may be formed between the gate electrode 260 and the second semiconductor layer 230 to realize a normally off property. The term "normally off property" used herein refers to a property in which an off state is when a voltage is not applied to the gate electrode 260, For example, in a normal mode, and an on state is when a voltage is applied to the gate electrode 260.

The third semiconductor layer 240 may be provided with a depletion region in the 2DEG layer 225 formed in the first semiconductor layer 220, thereby forming an area where the 2DEG layer 225 discontinues between the source electrode 310 and the drain electrode 320.

The third semiconductor layer 240 may have a thickness of about 10 nm to about 200 nm. When the thickness of the third semiconductor layer 240 is less than 10 nm, the depletion region may be not formed up to the 2DEG layer 225 of the first semiconductor layer 220, thus causing a normally on property where currents flow in an off state. When the thickness of the third semiconductor layer 240 is greater than 200 nm, the third semiconductor layer 240 may excessively increase the band gap energy of the first semiconductor layer 220 disposed thereunder and therefore may excessively increase the bias voltage applied to the gate electrode 260 to set to an on state.

Figure 15:
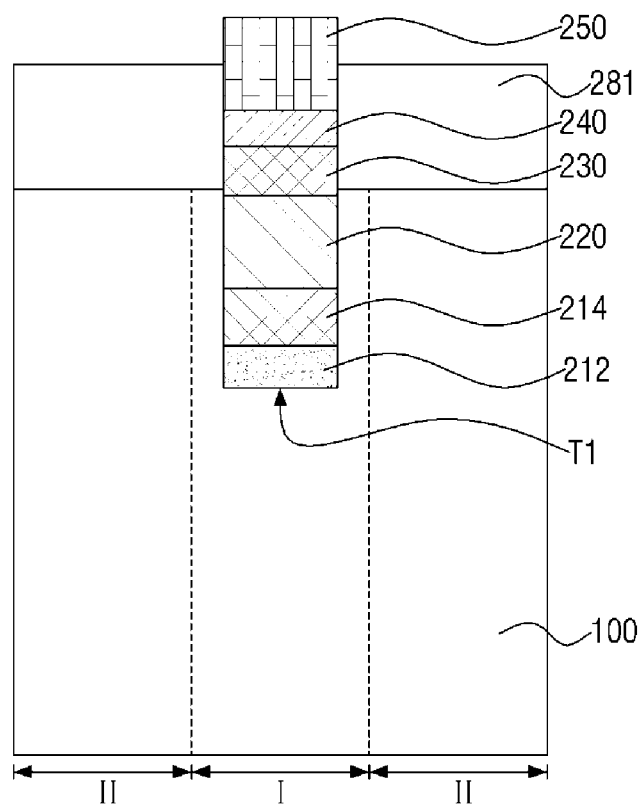

Next, referring to FIG. 15, a gate contact layer 250 is formed.

The gate contact layer 250 may be formed on the third semiconductor layer 240. A bottom surface of the gate contact layer 250 may be lower than the upper surface of the first passivation layer 281. For example, the lowermost surface of the gate contact layer 250 may be lower than the uppermost surface of the first passivation layer 281. An upper surface of the gate contact layer 250 may be higher than the upper surface of the first passivation layer 281. For example, the uppermost surface of the gate contact layer 250 may be higher than the uppermost surface of the first passivation layer 281. However, exemplary embodiments are not limited to the example given above.

The gate contact layer 250 may be formed on the third semiconductor layer 240. The gate contact layer 250 may be formed between the gate electrode 260 and the third semiconductor layer 240 for schottky barrier.

The gate contact layer 250 may be formed of a metal material including at least one of Ni, W and NiSi. However, exemplary embodiments are not limited to the example given above.

Figure 16:
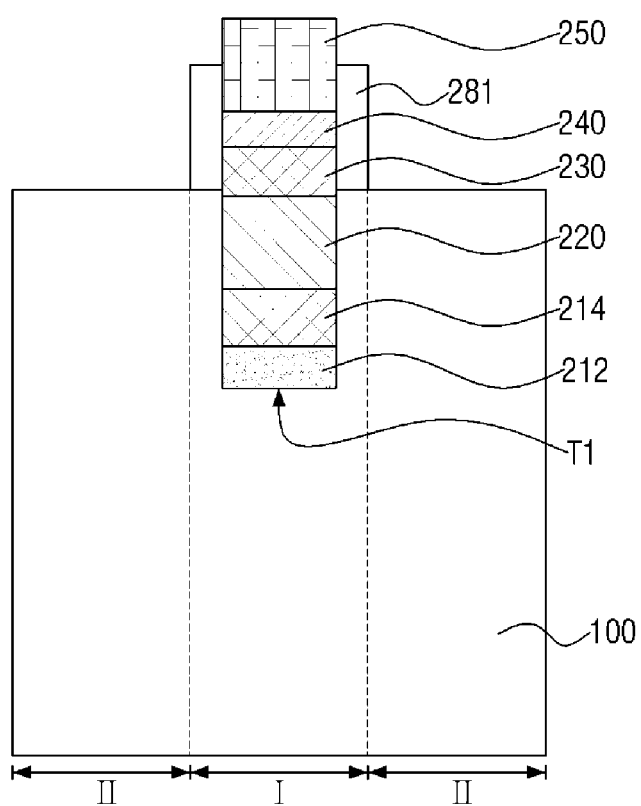

Next, referring to FIG. 16, a portion of the first passivation layer 281 is etched to expose upper surfaces of the second regions II of the substrate 100.

The first passivation layer 281 may contact side surfaces of the second semiconductor layer 230, the third semiconductor layer 240 and the gate contact layer 250. In some embodiments, only one portion of the first passivation layer 281 formed on the first region I of the substrate 100 may remain and the other portion of the first passivation layer 281 formed on the second region II may be removed. A source electrode 310 and a drain electrode 320 may be formed on the second regions II of the exposed substrate 100 later (e.g., after forming the passivation layer 281).

Figure 17:
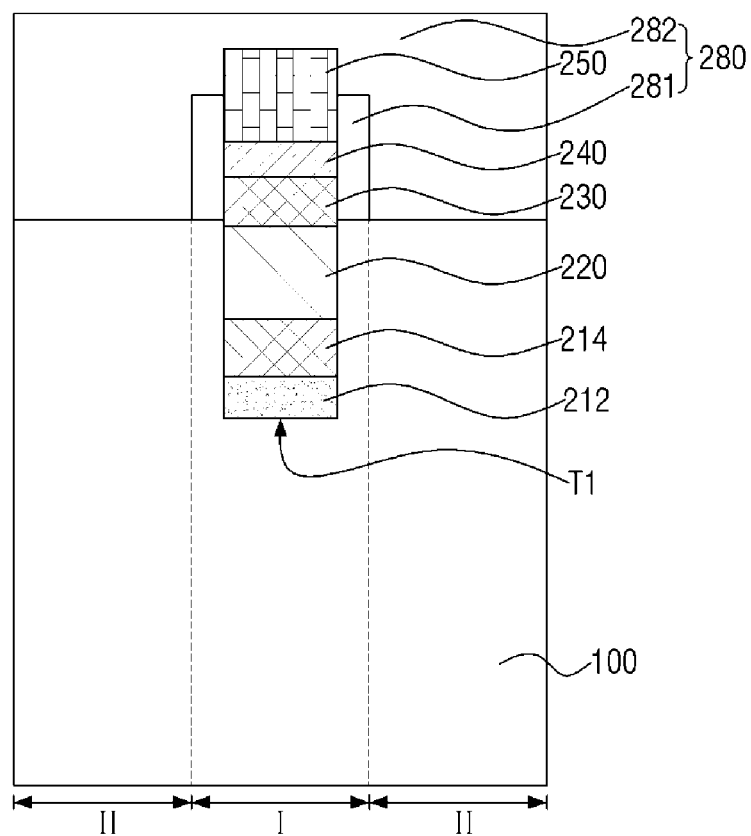

Next, referring to FIG. 17, a second passivation layer 282 is formed to cover the first passivation layer 281 and the gate contact layer 250.

The second passivation layer 282 may be formed on the first region I and the second regions II of the substrate 100. Specifically, the second passivation layer 282 may cover the first passivation layer 281 and the gate contact layer 250 in the first region I and may cover the substrate 100 in the second region II.

The second passivation layer 282 may include silicon oxide, silicon nitride, silicon oxynitride or the like. The first passivation layer 281 and the second passivation layer 282 may include identical or different materials.

Figure 18:
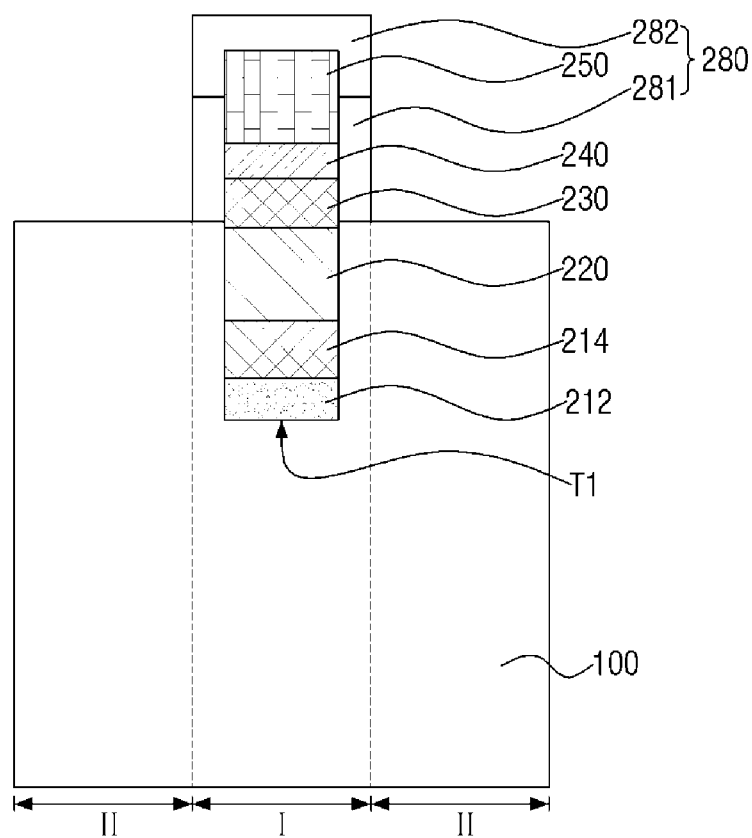

Next, referring to FIG. 18, a portion of the second passivation layer 282 is etched.

The portion of the second passivation layer 282 formed on the second region II of the substrate 100 may be removed. As a result, the upper surface of the second region II of the substrate 100 may be exposed. The second passivation layer 282 may be formed to contact the upper surface of the first passivation layer 281 and the upper and side surfaces of the gate contact layer 250 in the first region I.

Figure 19:
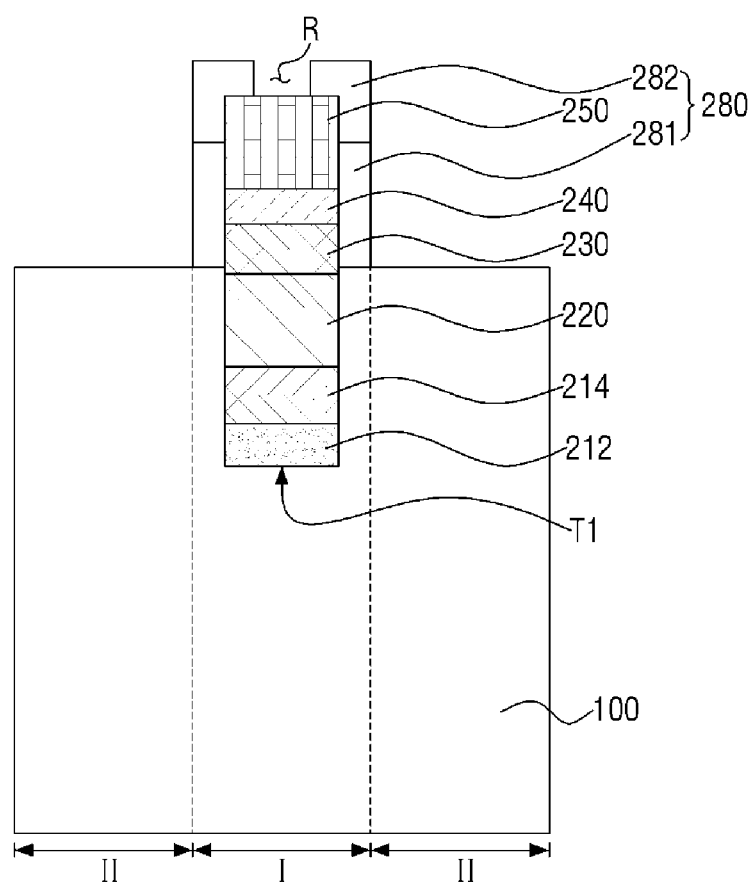

Next, referring to FIG. 19, a portion of the second passivation layer 282 is etched to form a recess R.

As a result of formation of the recess R, a portion of the upper surface of the gate contact layer 250 may be exposed. The recess R may be formed by removing only a portion of the upper surface of the second passivation layer 282. As a result, one portion of the upper surface of the gate contact layer 250 is exposed and the remaining portion thereof may be covered with the second passivation layer 282.

Figure 20:
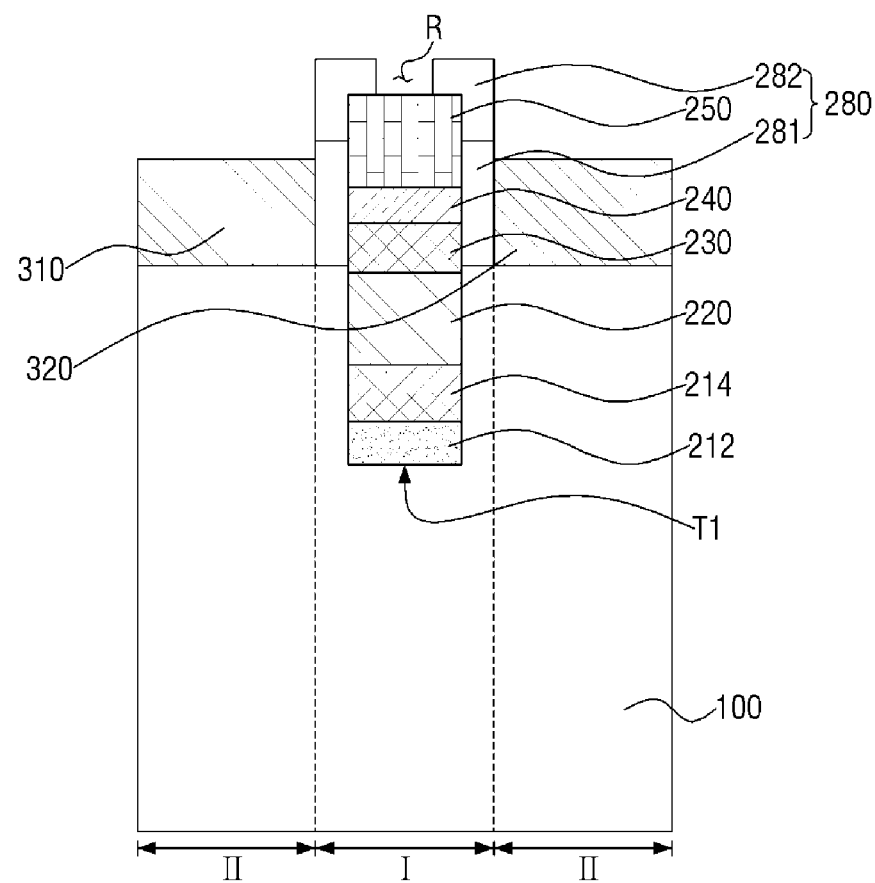

Next, referring to FIG. 20, a source electrode 310 and a drain electrode 320 are formed.

The source electrode 310 and the drain electrode 320 may be formed on the second regions II of the substrate 100. The source electrode 310 and the drain electrode 320 may be spaced apart from each other via the first passivation layer 281, the second semiconductor layer 230, the third passivation layer 240 and the gate contact layer 250.

In some embodiments, the source electrode 310 and the drain electrode 320 may contact the first passivation layer 281 and the second passivation layer 282, respectively. The portion of the first semiconductor layer 220 formed between the source electrode 310 and the drain electrode 320 is provided therein with the 2DEG layer 224, which may function as a channel region of the semiconductor device according to some exemplary embodiments.

The source electrode 310 and the drain electrode 320 may be formed of a material selected from the group consisting of Ni, Al, Ti, TiN, Pt, Au, $RuO^2$, V, W, WN, Hf, HfN, Mo, NiSi, $CoSi_2$, WSi, PtSi, Ir, Zr, Ta, TaN, Cu, Ru, Co and a combination thereof. Regarding the semiconductor device according to some exemplary embodiments, the source electrode 310 and the drain electrode 320 may be formed by forming an ohmic contact with the substrate 100 using metals such as Ta/Al/W/TiN and then conducting heat treatment at 500 to 550° C. Alternatively, the source electrode 310 and the drain electrode 320 may be formed of Ta/Al/Ni/Au.

Figure 21:
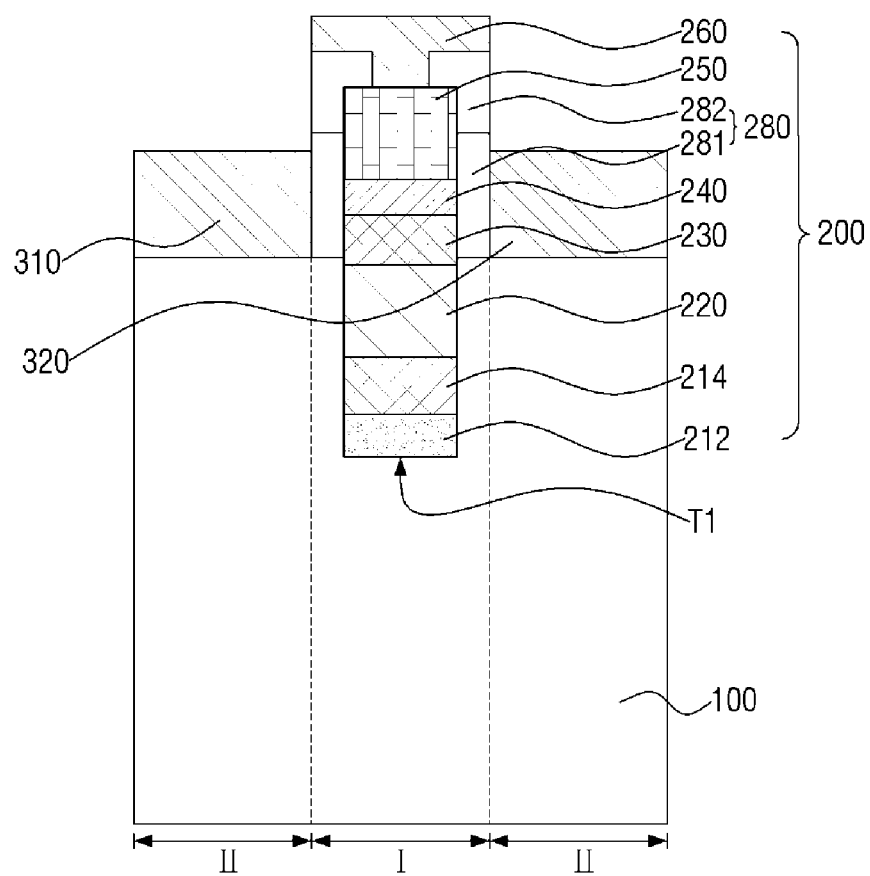

Next, referring to FIG. 21, a gate electrode 260 is formed.

The gate electrode 260 may entirely fill the recess R. The gate electrode 260 may be formed on the gate contact layer 250 and the second passivation layer 282. The gate electrode 260 may have a "T" shape, as shown in the drawing, but the disclosure is not limited thereto.

The gate electrode 260 may be formed on the third semiconductor layer 240 between the source electrode 310 and the drain electrode 320. The gate electrode 260 may be formed to overlap the third semiconductor layer 240. The width of the gate electrode 260 is substantially equal to that of the third semiconductor layer 240 as shown in FIG. 1, but the width of the gate electrode 260 may be less than that of the third semiconductor layer 240 in some embodiment.

The gate electrode 260 may be formed of a material selected from the group consisting of Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co and a combination thereof.

Hereinbelow, a method of fabricating a semiconductor device according to some exemplary embodiments will be described with reference to FIGS. 5 and 22 to 29. Items overlapping with those described above with reference to the semiconductor device shown in FIGS. 1 to 7 and the method of fabricating the same shown in FIGS. 8 to 21 will be mentioned as briefly as possible or omitted for the sake of brevity.

FIGS. 22 to 29 are views illustrating intermediate stages of fabrication, provided to explain a method of fabricating a semiconductor device according to some exemplary embodiments.

Figure 22:
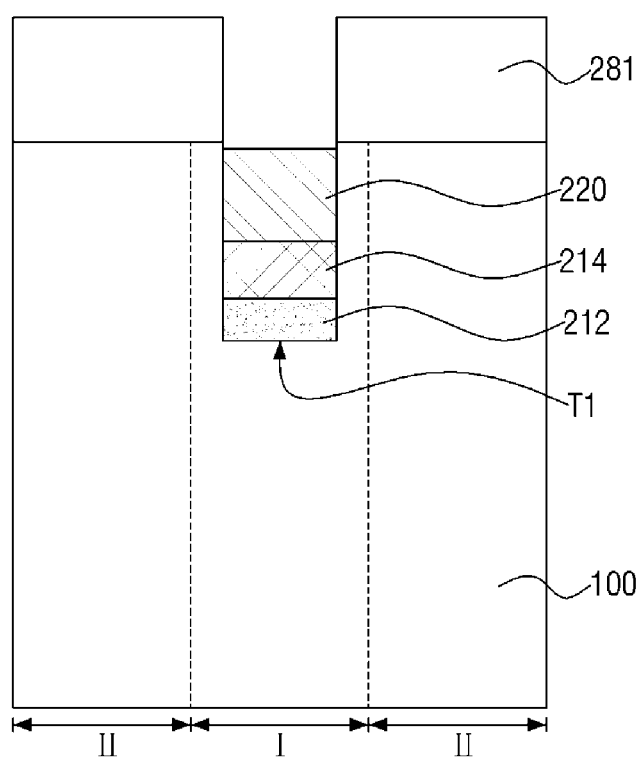

First, referring to FIG. 22, a first buffer layer 212, a second buffer layer 214 and a first semiconductor layer 220 are formed in a first trench T1 of a substrate 100.

The first trench T1 is formed in the first region I of the substrate 100, and the first buffer layer 212, the second buffer layer 214, and the first semiconductor layer 220 are sequentially formed such that they may fill only a portion of the first trench T1.

The first passivation layer 281 may be formed on the second region II of the substrate 100 and a portion of the first region I. For example, it may be formed in a region not overlapping the first trench T1.

Figure 23:
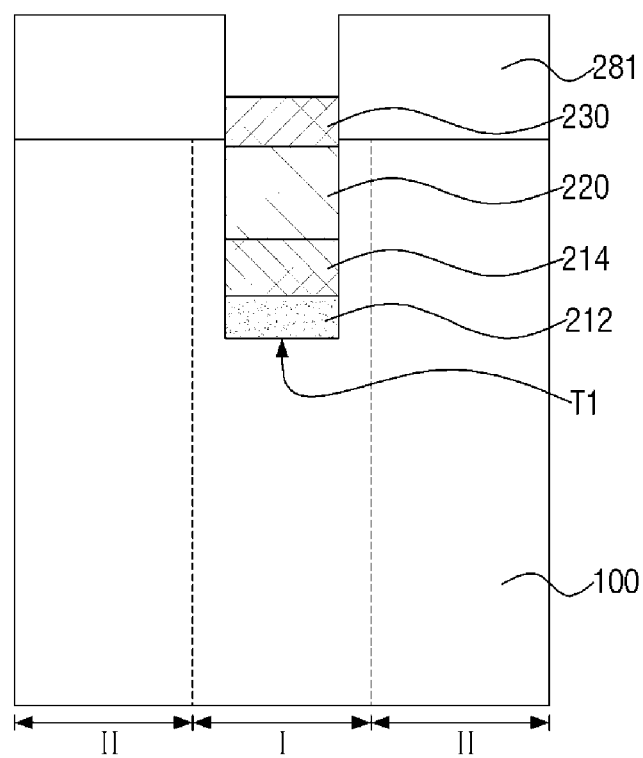

Next, referring to FIG. 23, a second semiconductor layer 230 is formed on the first semiconductor layer 220.

A 2DEG layer may be formed within the first semiconductor layer 220 by hetero-junction between the second semiconductor layer 230 and the first semiconductor layer 220.

Figure 24:
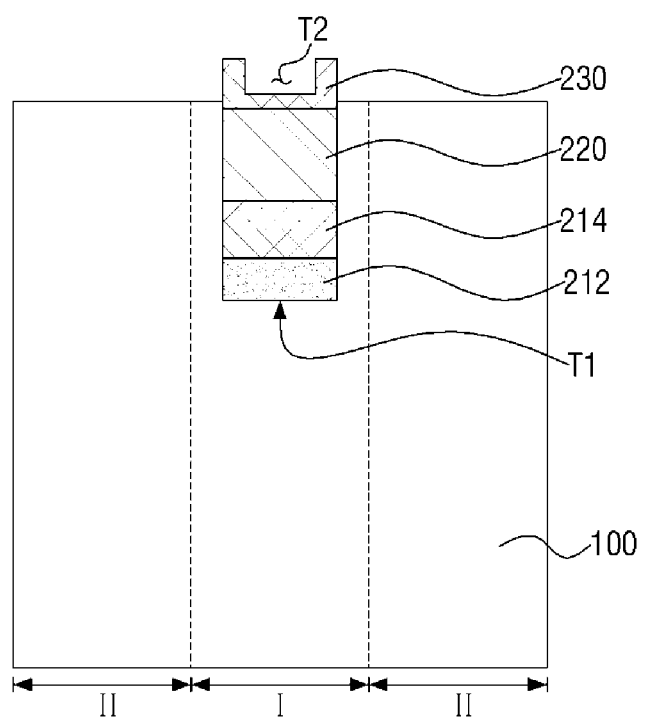

Next, referring to FIG. 24, a second trench T2 is formed on the second semiconductor layer 230.

The second trench T2 may be formed on the second semiconductor layer 230. The second trench T2 may be formed by removing a portion of the second semiconductor layer 230. The second trench T2 may decrease the thickness of the portion of the second semiconductor layer 230.

The second semiconductor layer 230 which decreases in thickness due to formation of the second trench T2 may not form the 2DEG layer 225 although it is connected to the first semiconductor layer 220. As a result, the 2DEG layer 225 may have a depletion region S. The depletion region S may overlap a portion of the second semiconductor layer 230 where the second trench T2 is formed in a third direction Z.

In this exemplary embodiment, the first passivation layer 281 may be removed. For example, the upper surface of the substrate 100 may be exposed on the second region II and a portion of the first region I.

Figure 25:
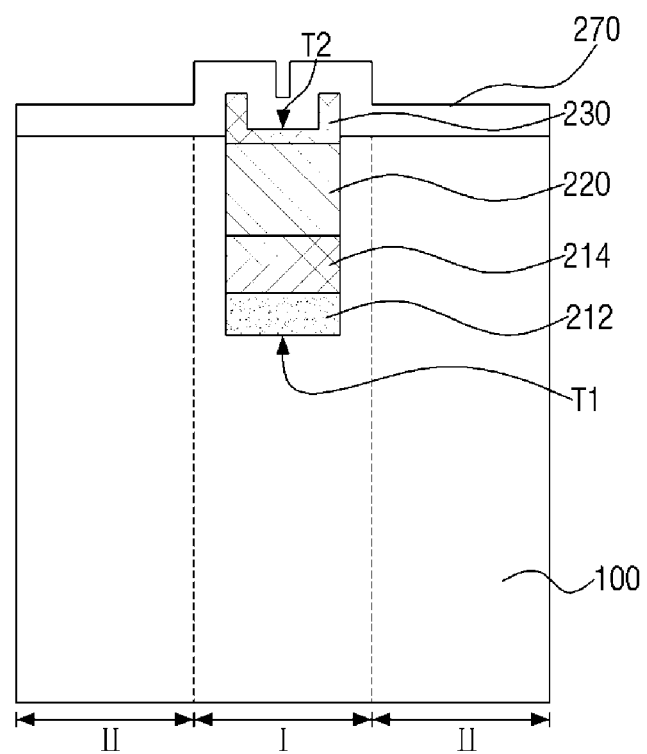

Next, referring to FIG. 25, a gate insulating film 270 is formed.

The gate insulating film 270 may be formed on the second semiconductor layer 230 and the substrate 100. The gate insulating film 270 may be conformally formed along upper surfaces of the second semiconductor layer 230 and the substrate 100. However, exemplary embodiments are not limited to the example given above. The gate insulating film 270 may be formed on the first region I and the second region II of the substrate 100.

The gate insulating film 270 may for example include at least one of $Al_2O_3$, $SiO_x$, $Si_xN_y$, $Sc_2O^3$, AlN, $Ga_2O_3$, $Gd_2O_3$, $Al_xGa_{2(1-x)}O_3$, MgO and a combination thereof. Also, any material may be used for the gate insulating film 270 without limitation to those described above so long as it is a gate insulating film material used in general transistors.

In the semiconductor device according to this exemplary embodiment, the gate insulating film 270 may be formed of $Al_2O_3$. The gate insulating film 270 of $Al_2O_3$ may be formed to a thickness of about 20 to 50 nm by atomic layer deposition (ALD). However, exemplary embodiments are not limited to the specific thickness example given above.

The gate insulating film 270 may not entirely fill the second trench T2. Accordingly, another trench may be formed on the gate insulating film 270.

Figure 26:
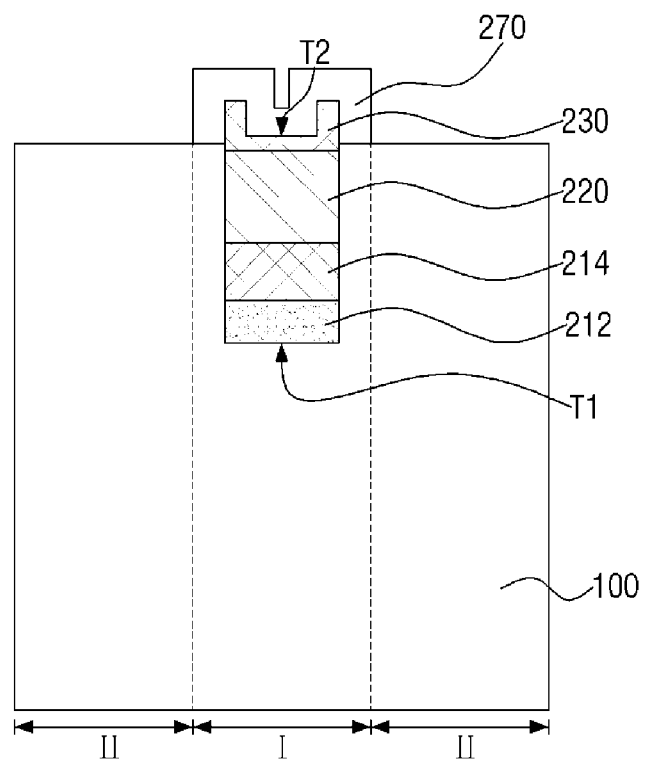

Next, referring to FIG. 26, a portion of the gate insulating film 270 is etched.

One portion of the gate insulating film 270 formed on the first region I may remain. The other portion of the gate insulating film 270 formed on the second regions II may be removed. As a result, the upper surfaces of the second regions II of the substrate 100 may be exposed. A source electrode 310 and a drain electrode 320 may be formed on the second regions II of the exposed substrate 100 later.

Figure 27:
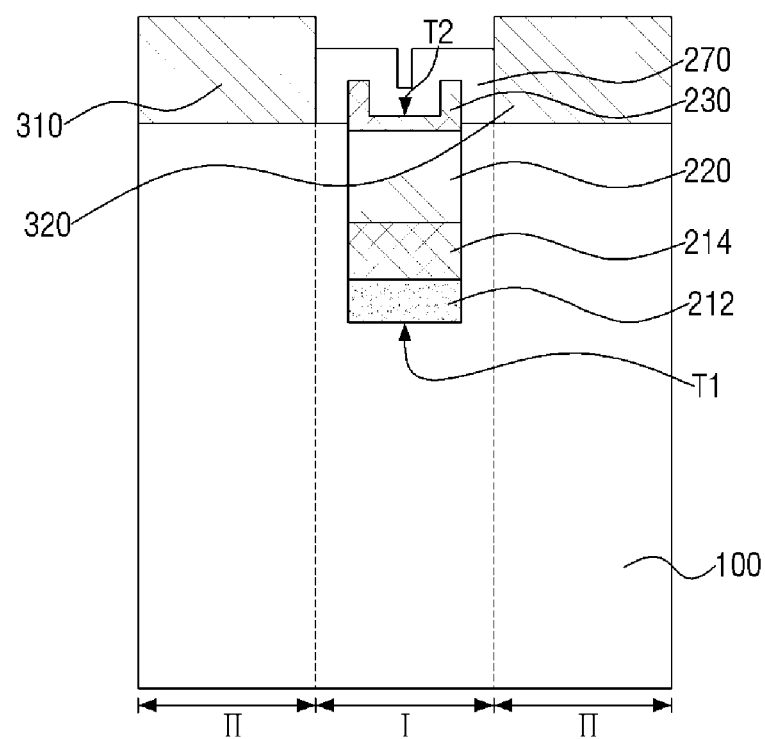

Next, referring to FIG. 27, the source electrode 310 and the drain electrode 320 are formed.

The source electrode 310 and the drain electrode 320 may be formed on the second regions II of the substrate 100. The source electrode 310 and the drain electrode 320 may be spaced apart from each other via the gate insulating film 270 and the second semiconductor layer 230.

Figure 28:
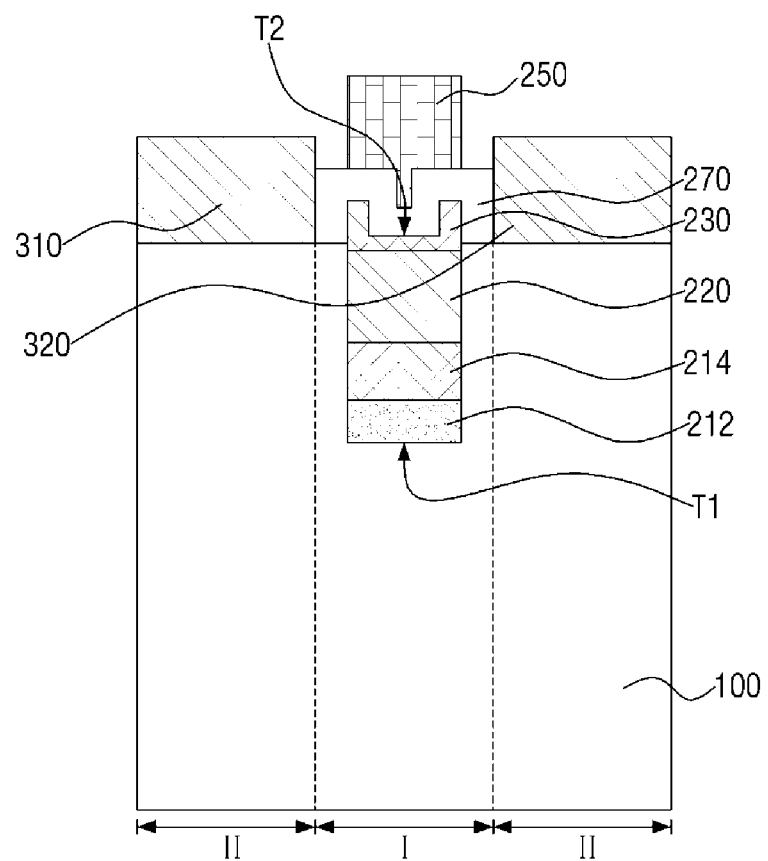

Next, referring to FIG. 28, a gate contact layer 250 is formed.

The gate contact layer 250 may be formed on the gate insulating film 270. The gate contact layer 250 may entirely fill the second trench T2. The gate contact layer 250 may fill the other trench formed on the gate insulating film 270. In this exemplary embodiment, the gate contact layer 250 may be formed in a region vertically overlapping the first buffer layer 212, the second buffer layer 214, the first semiconductor layer 220 and the second semiconductor layer 230.

Figure 29:
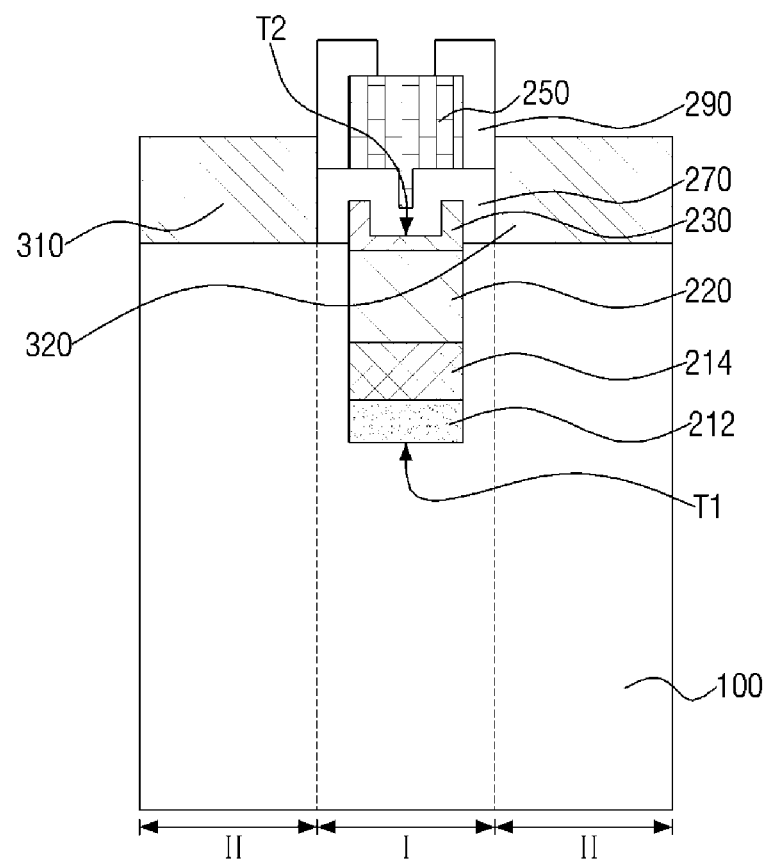

Next, referring to FIG. 29, a third passivation layer 290 is formed.

The third passivation layer 290 may be formed on the gate insulating film 270. The third passivation layer 290 may surround side surfaces of the gate contact layer 250. The third passivation layer 290 may surround a portion of a side surface of a gate electrode 260.

In this case, the third passivation layer 290 may include the recess exposing a portion of the upper surface of the gate contact layer 250.

Next, referring to FIG. 5, the gate electrode 260 is formed.

Regarding the semiconductor device according to some exemplary embodiments, the second trench T2 formed on the second semiconductor layer 230 may reduce the thickness of the second semiconductor layer 230, thereby causing formation of depletion region S. As a result, there can be achieved the normally off property in which an off-state is in a normal mode and an on-state is only when a voltage is applied to the gate electrode 260.

Hereinbelow, a method for fabricating a semiconductor device according to some exemplary embodiments will be described with reference to FIGS. 6 and 30 to 37. Items overlapping with those described above with reference to the semiconductor device shown in FIGS. 1 to 7 and the method of fabricating the same shown in FIGS. 8 to 29 will be mentioned as briefly as possible or omitted for the sake of brevity.

FIGS. 30 to 37 are views illustrating intermediate stages of fabrication, provided to explain a method for fabricating a semiconductor device according to some exemplary embodiments.

Figure 30:
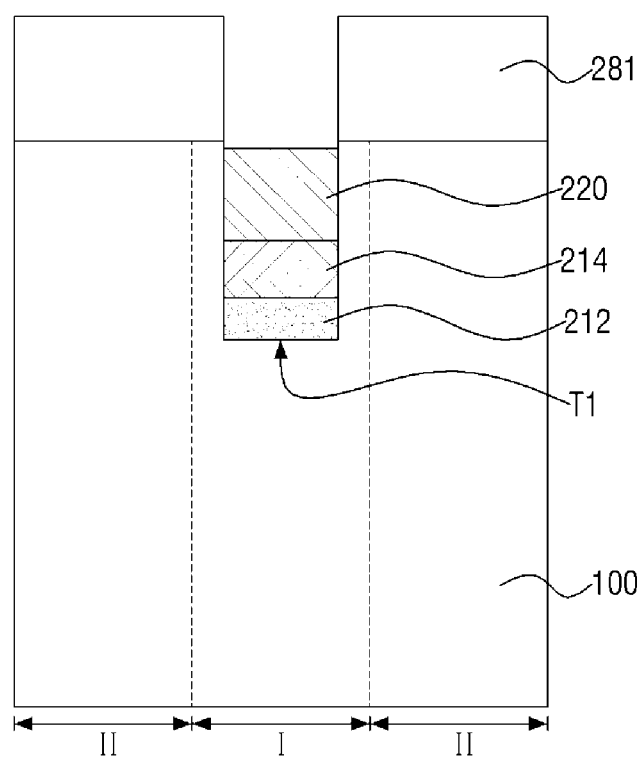

First, referring to FIG. 30, a first buffer layer 212, a second buffer layer 214 and a first semiconductor layer 220 are formed in a first trench T1 of a substrate 100.

The first trench T1 may be formed in the first region I of the substrate 100 and the first buffer layer 212, the second buffer layer 214 and the first semiconductor layer 220 may be sequentially formed such that they fill only a portion of the first trench T1.

The first passivation layer 281 may be formed on the second region II and a portion of the first region I of the substrate 100. For example, the first passivation layer 291 may be formed in a region not overlapping the first trench T1.

Figure 31:
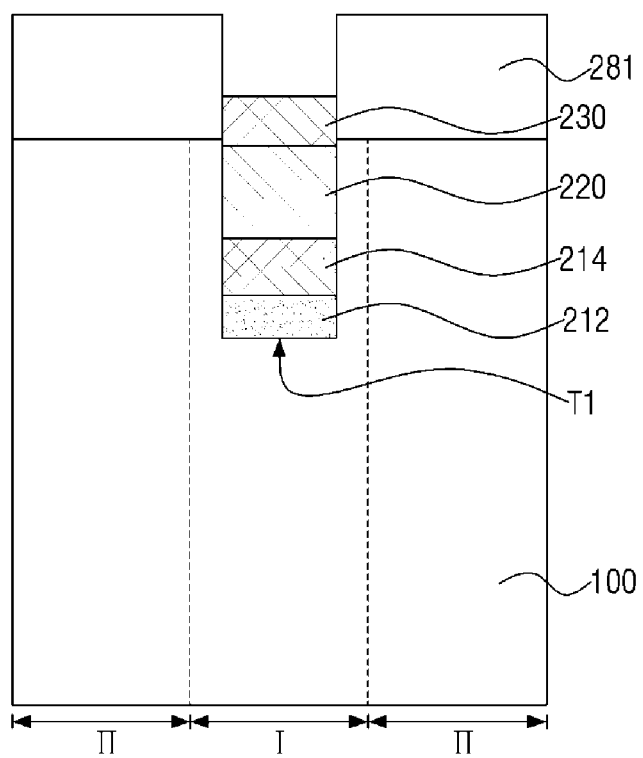

Next, referring to FIG. 31, a second semiconductor layer 230 is formed on the first semiconductor layer 220.

A 2DEG layer may be formed within the first semiconductor layer 220 by hetero-junction between the second semiconductor layer 230 and the first semiconductor layer 220.

Figure 32:
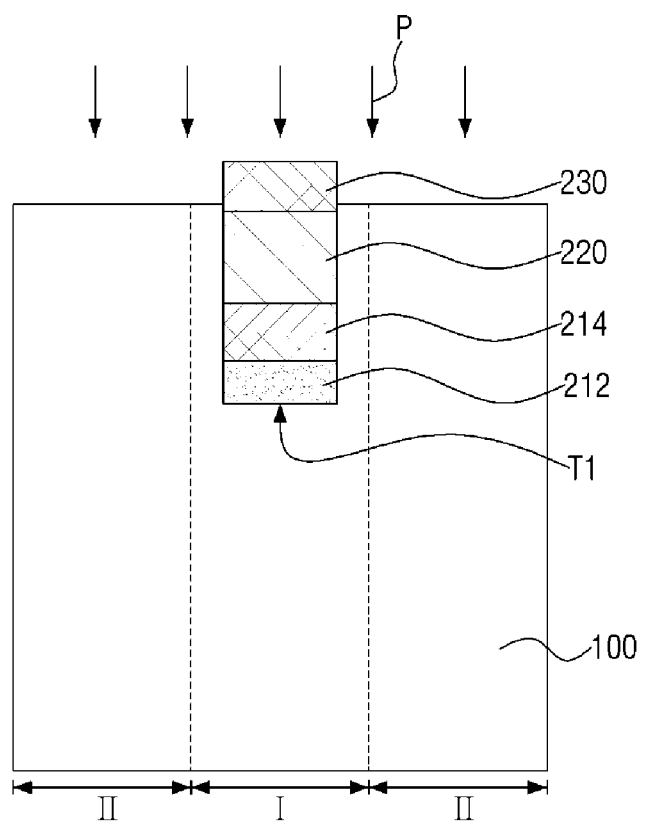

Next, referring to FIG. 32, an upper surface of the second semiconductor layer 230 is treated with plasma P.

As a result, a depletion region S where the 2DEG layer 225 is not formed may be formed in spite of hetero-junction between the first semiconductor layer 220 and the second semiconductor layer 230. For example, the 2DEG layer 225 may be not formed or partially discontinuously formed by plasma treatment P of the second semiconductor layer 230.

After plasma treatment P, the first passivation layer 281 may be removed. As a result, the second regions II and the portion of the first region I on the substrate 100 may be exposed.

Figure 33:
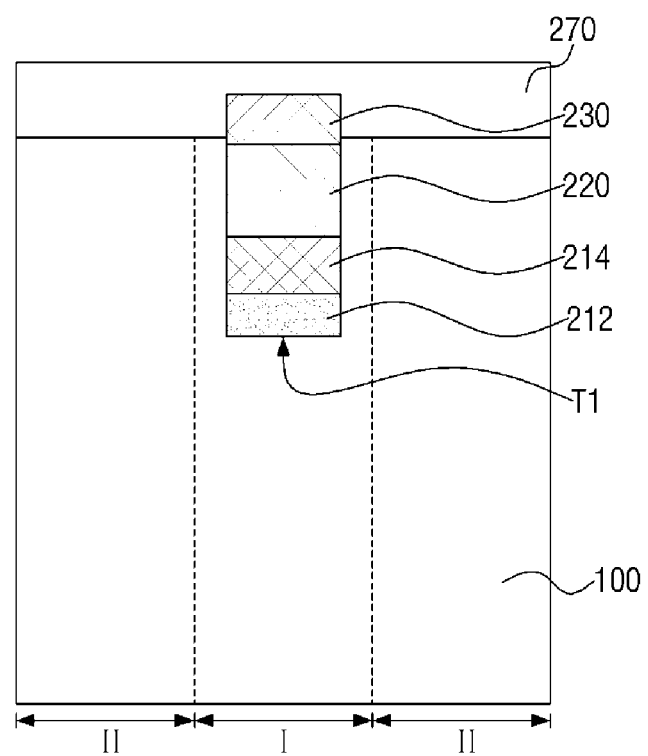

Next, referring to FIG. 33, a gate insulating film 270 is formed.

The gate insulating film 270 may be formed on the second semiconductor layer 230 and the substrate 100. The gate insulating film 270 may be formed on the first region I and the second regions II of the substrate 100.

The gate insulating film 270 may for example include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO and a combination thereof. Also, any material may be used for the gate insulating film 270 without limitation to those described above so long as it is a gate insulating film material used in general transistors.

In the semiconductor device according to this exemplary embodiment, the gate insulating film 270 may be formed of $Al_2O_3$. The gate insulating film 270 of $Al_2O_3$ may be formed to a thickness of about 20 to 50 nm by atomic layer deposition (ALD). However, exemplary embodiments are not limited to the thickness example given above.

Figure 34:
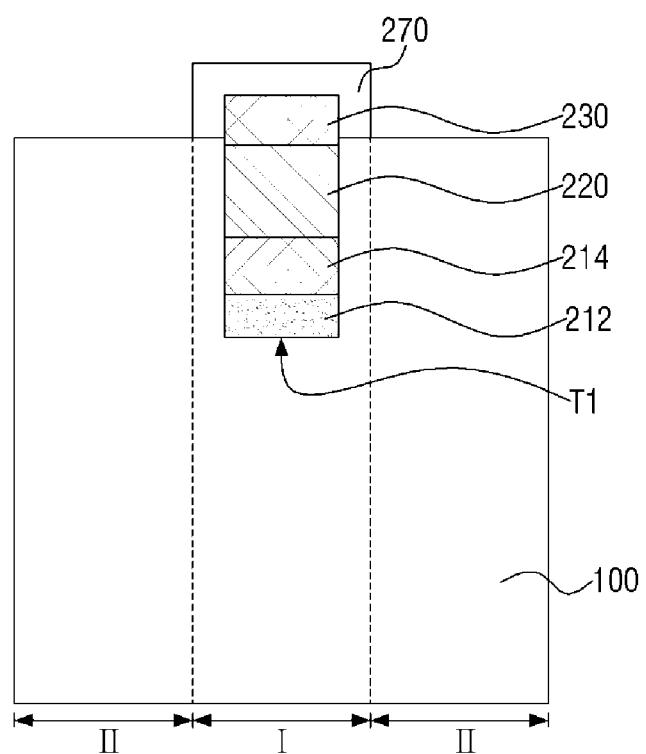

Next, referring to FIG. 34, a portion of the gate insulating film 270 is etched.

One portion of the gate insulating film 270 formed on the first region I may remain. The other portion of the gate insulating film 270 formed on the second regions II may be removed. As a result, the upper surfaces of the second regions II of the substrate 100 may be exposed. A source electrode 310 and a drain electrode 320 may be formed on the second regions II of the exposed substrate 100 later.

Figure 35:
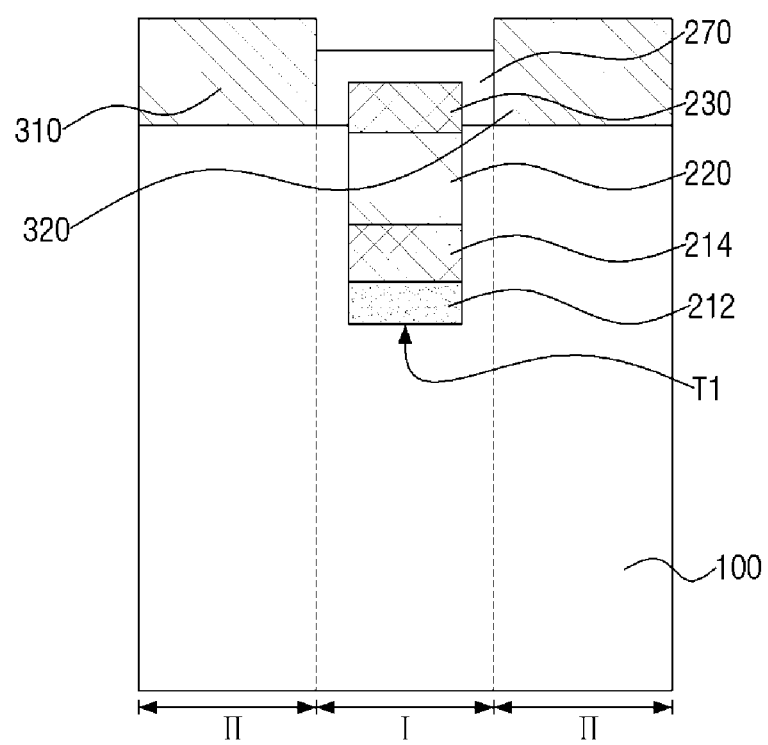

Next, referring to FIG. 35, the source electrode 310 and the drain electrode 320 are formed.

The source electrode 310 and the drain electrode 320 may be formed on the second regions II of the substrate 100. The source electrode 310 and the drain electrode 320 may be spaced apart from each other via the gate insulating film 270 and the second semiconductor layer 230.

Figure 36:
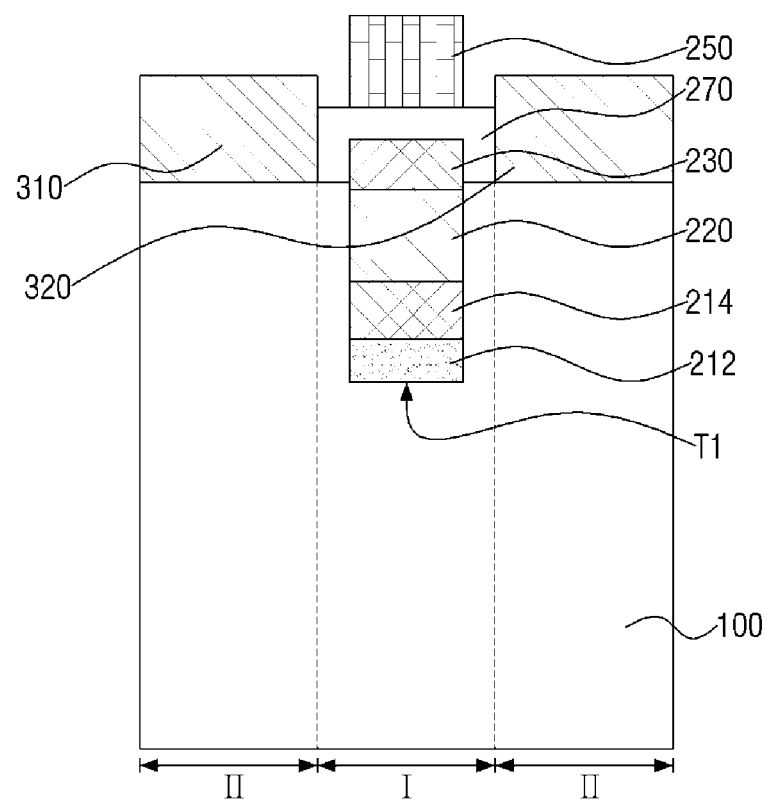

Next, referring to FIG. 36, a gate contact layer 250 is formed.

The gate contact layer 250 may be formed on the gate insulating film 270. The gate contact layer 250 may be formed in a region vertically overlapping the first buffer layer 212, the second buffer layer 214, the first semiconductor layer 220 and the second semiconductor layer 230.

Figure 37:
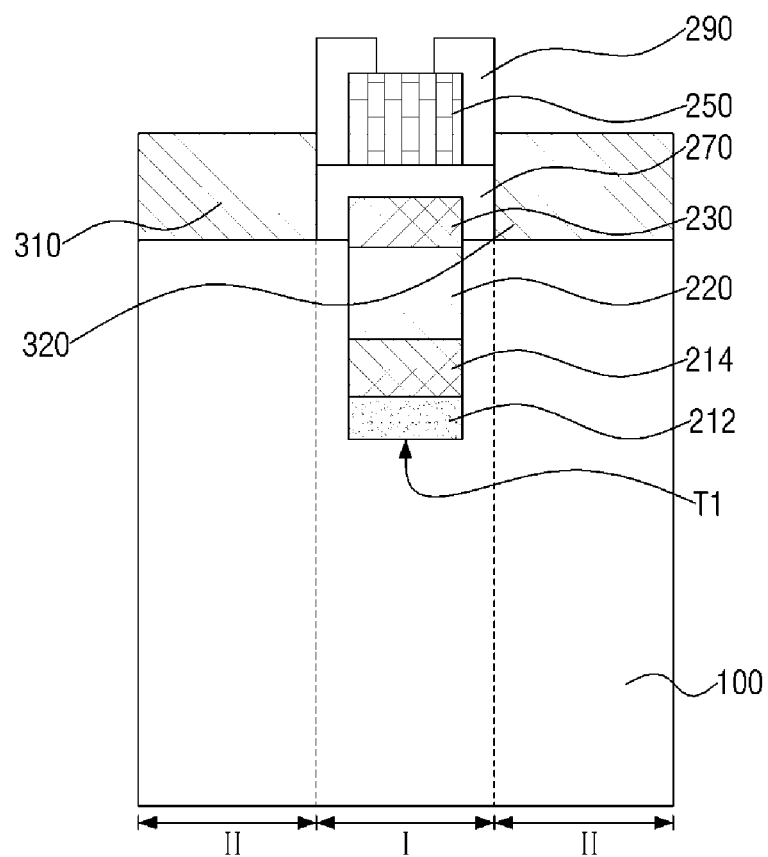

Next, referring to FIG. 37, a third passivation layer 290 is formed.

The third passivation layer 290 may be formed on the gate insulating film 270. The third passivation layer 290 may surround side surfaces of the gate contact layer 250. The third passivation layer 290 may surround a portion of a side surface of a gate electrode 260.

In this case, the third passivation layer 290 may include the recess exposing a portion of the upper surface of the gate contact layer 250.

Next, referring to FIG. 6, the gate electrode 260 is formed.

Regarding the semiconductor device according to some exemplary embodiments, the second semiconductor layer 230 may be treated with plasma, thereby causing formation of depletion region S. As a result, there can be achieved the normally off property in which an off-state is in a normal mode and an on-state is only when a voltage is applied to the gate electrode 260.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a semiconductor substrate comprising a first region and a second region disposed at opposite sides of the first region;
   a first trench formed in the semiconductor substrate in the first region;
   a buffer layer formed at a bottom of the first trench to fill a portion of the first trench;
   a first semiconductor layer formed on the buffer layer;
   a second semiconductor layer forming a hetero-junction with the first semiconductor layer on the first semiconductor layer of the first region,
   a second trench formed in the second semiconductor layer
   a gate insulating film formed on the second semiconductor layer;
   a gate electrode formed on the gate insulating film; and
   a gate contact layer formed between the gate insulating film and the gate electrode,
   wherein the gate insulating film extends into the second trench and
   the gate contact layer extends into the second trench.

2. The semiconductor device of claim 1, wherein the semiconductor device has normally off property.

3. The semiconductor device of claim 1, further comprising a third semiconductor layer doped with a p-type impurity formed on the second semiconductor layer of the first region.

4. The semiconductor device of claim 3, wherein the third semiconductor layer includes at least one of P-AlGaN and P-GaN.

5. The semiconductor device of claim 1, wherein the gate contact layer includes at least one of Ni, W and NiSi.

6. The semiconductor device of claim 1, wherein the buffer layer comprises a first buffer layer, and
   a second buffer layer formed on the first buffer layer and having a plurality of layers stacked with different Al contents.

* * * * *